United States Patent [19]
Terasawa

[11] Patent Number: 5,930,651
[45] Date of Patent: *Jul. 27, 1999

[54] METHOD OF FORMING A SEMICONDUCTOR DEVICE HAVING A PLURALITY OF CAVITY DEFINED GATING REGIONS

[75] Inventor: Yoshio Terasawa, Hitachinaka, Japan

[73] Assignee: NGK Insulators, Ltd., Japan

[ * ] Notice: This patent is subject to a terminal disclaimer.

[21] Appl. No.: 08/814,787

[22] Filed: Mar. 10, 1997

Related U.S. Application Data

[62] Division of application No. 08/430,805, Apr. 26, 1995, Pat. No. 5,648,665.

[30] Foreign Application Priority Data

Apr. 28, 1994 [JP] Japan ................................. 6-92478

[51] Int. Cl.⁶ ............................. H01L 21/30; H01L 21/46
[52] U.S. Cl. ........................ 438/456; 438/137; 438/193
[58] Field of Search ................................... 438/270, 137, 438/193, 259, 286, 456

[56] References Cited

U.S. PATENT DOCUMENTS

| | | | |
|---|---|---|---|
| 4,528,745 | 7/1985 | Muraoka et al. | 29/576 |
| 5,086,330 | 2/1992 | Minato | 257/263 |
| 5,153,695 | 10/1992 | Gobrecht et al. | 357/38 |
| 5,352,909 | 10/1994 | Hori | 257/76 |
| 5,442,214 | 8/1995 | Yang | 257/328 |
| 5,545,905 | 8/1996 | Muraoka et al. | 257/268 |
| 5,591,991 | 1/1997 | Terasawa | 257/137 |
| 5,648,665 | 7/1997 | Terasawa | 257/136 |
| 5,739,044 | 4/1998 | Terasawa | 438/137 |

FOREIGN PATENT DOCUMENTS

| | | |
|---|---|---|
| 0 022 483 A1 | 1/1981 | European Pat. Off. . |
| 0 425 037 A2 | 5/1991 | European Pat. Off. . |
| 0 425 037 A3 | 5/1991 | European Pat. Off. . |
| 28-6077 | 11/1953 | Japan . |
| 57-9226 | 2/1982 | Japan . |
| 59-17547 | 4/1984 | Japan . |
| 60-5064 | 2/1985 | Japan . |
| 1-26187 | 5/1989 | Japan . |
| WO 95/04375 | 2/1995 | WIPO . |

OTHER PUBLICATIONS

J. Nishizawa et al. "Effects of Gate Structure on Static Induction Thyristor", Tech. Dig. 1980 IEDM, 1980, pp. 658–661.

J. Nishizawa et al. "Analysis of Characteristic of Static Induction Thyristor", Tech. Res. Report, Electr. Comm. Soc. ED81–84 (1981) pp. 31–38; with Engl. Trans.

J. Nishizawa et al. "Static Induction Thyristor", Tech. Res. Report, Electr. Comm. Soc., ED81–7 (1981) pp. 49–55; with English–language Translation.

*Primary Examiner*—John F. Niebling
*Assistant Examiner*—John Murphy
*Attorney, Agent, or Firm*—Parkhurst & Wendel, L.L.P

[57] ABSTRACT

A $P^+$ layer is formed on the lower surface of an $N^-$ substrate, and recesses are defined in the upper surface of the $N^-$ substrate. Then, $P^+$ gate regions and bottom gate regions are formed in side walls and bottoms of the recesses. The $N^-$ substrate and an $N^-$ substrate are ultrasonically cleaned to remove impurities therefrom, then cleaned by pure water, and dried by a spinner. Then, while lands on the upper surface of the $N^-$ substrate are being held against the surface of the $N^-$ substrate, the $N^-$ substrates are joined to each other by heating them at 800° C. in a hydrogen atmosphere.

24 Claims, 27 Drawing Sheets

METHOD OF FORMING A SEMICONDUCTOR DEVICE HAVING A PLURALITY OF CAVITY DEFINED GATING REGIONS

This is a Division of application Ser. No. 08/430,805 filed Apr. 26, 1995, now U.S. Pat. No. 5,648,665.

BACKGROUND OF THE INVENTION

1. Field of the Invention

The present invention relates to a semiconductor device and a method of fabricating such a semiconductor device, and more particularly to a static induction (SI) thyristor and a method of fabricating such a static induction thyristor.

2. Description of the Related Art

FIGS. 26 and 27 of the accompanying drawings show in fragmentary sectional cross section a conventional static induction thyristor and a process of fabricating the static induction thyristor.

The conventional static induction thyristor, generally denoted at 100, is fabricated as follows:

First, as shown in FIG. 26, $N^-$ substrates 10, 20 having respective mirror-finished surfaces to be joined to each other are prepared.

Then, a $P^+$ layer 12 is formed on the lower surface of the $N^-$ substrate 10 by diffusing an impurity therein. Recesses 40 for accommodating gate electrodes 90 therein are formed in the upper mirror-finished surface of the $N^-$ substrate 10 by photolithography. Thereafter, a P-type impurity is selectively diffused to form $P^+$ gate regions 130 selectively in respective bottoms 44 of the recesses 40. Then, gate electrodes 90 of tungsten are formed selectively on the $P^+$ gate regions 130 in the respective recesses 40 by photolithography.

An $N^+$ layer 22 is formed on the upper surface of the $N^-$ substrate 20 by diffusing an impurity therein.

Then, the $N^-$ substrates 10, 20 are ultrasonically cleaned in an aqueous solution of sulfuric acid and hydrogen peroxide to remove organic materials and metals therefrom.

The $N^-$ substrates 10, 20 are thereafter cleaned by pure water, and then dried by a spinner at a room temperature.

Then, as shown in FIG. 27, while lands 14 between the recesses 40 in the upper surface of the $N^-$ substrate 10 are being held against a lower mirror-finished surface 24 of the $N^-$ substrate 20, the $N^-$ substrates 10, 20 are joined to each other by heating them in a hydrogen atmosphere.

Thereafter, an anode electrode 60 and a cathode electrode 70 are formed respectively on the lower surface of the $P^+$ layer 12 which is formed on the lower surface of the $N^-$ substrate 10 and the upper surface of the $N^+$ layer 22 which is formed on the upper surface of the $N^-$ substrate 20.

In the static induction thyristor 100 thus fabricated, the $P^+$ layer 12 functions as an anode, the $N^+$ layer 22 as a cathode, the $N^-$ substrates 10, 20 as an N base 50, and the $P^+$ gate regions 130 and the gate electrodes 90 as a gate for controlling an anode current flowing between the anode electrode 60 and the cathode electrode 70.

Because the N base 50 in which the $P^+$ gate regions 130 are embedded is produced by joining the $N^-$ substrates 10, 20, the N base 50 has uniform, high-quality crystallinity. The conductivity type of the N base 50 between the $P^+$ gate regions 130 does not change into a P type which would otherwise be caused if an $N^-$ layer were deposited by epitaxial growth after the formation of the $P^+$ gate regions 130, making it impossible to control an anode current.

Since the gate electrodes 90 of tungsten are disposed on the $P^+$ gate regions 130, the lateral resistance of the gate is reduced, increasing a maximum cutoff current. The gate electrodes 90 are accommodated in the recesses 40 in the $N^-$ substrate 10 before the $N^-$ substrates 10, 20 are joined to each other. Consequently, it is not necessary to form grooves of a large aspect ratio in the $N^+$ layer 22 and the $N^-$ substrate 20 and then form the gate electrodes 90 in such grooves, and the $N^+$ layer 22 and the $N^-$ substrate 20 would not be divided by such grooves into small strips which would impose a high resistance.

The formation of the recesses 40 in the upper surface of the $N^-$ substrate 10 is not time-consuming because the recesses 40 only need to be capable of holding the gate electrodes 90 therein.

As the gate electrodes 90 are accommodated in the recesses 40 defined in the upper surface of the $N^-$ substrate 10, no recesses are required to be formed in the lower surface 24 of the $N^-$ substrate 20 which is to be joined by the lands 14 on the upper surface of the $N^-$ substrate 10, and hence the lower surface 24 may remain flatwise. Since no special alignment is necessary to join the lands 14 on the upper surface of the $N^-$ substrate 10 to the lower surface 24 of the $N^-$ substrate 20, it is easy to fabricate the static induction thyristor 100.

Publications which disclose semiconductor devices of interest are as follows:

<Patent publications>

Japanese patent No. 1131903; and

Japanese patent publication No. 1-26187.

<General publications>

J. Nishizawa "Development of high-power static induction transistors", Report on a research project funded by a subsidy granted for commissioned research by the Agency of Industrial Science and Technology in the Ministry of International Trade and Industry, 1969;

J. Nishizawa "High-power vertical joint FET with triode characteristics", Nikkei Electronics, pages 50–61, Sep. 27, 1971;

J. Nishizawa, T. Terasaki, and J. Shibata "Field-Effect Transistor versus Analog Transistor (Static Inductial Transistor)", IEEE Trans. on Electron Devices, Vol. ED-22 (4), 185 (1975);

J. Nishizawa and K. Nakamura, Rev. de Physiquee Appliquee, T13, 725 (1978);

J. Nishizawa and Y. Otsubo, Tech. Dig. 1980 IEDM, 658 (1980); and

J. Nishizawa, T. Ohmi, M. Sha, and K. Kitani, Technical Research Report, Electronics Communications Society, ED81–84 (1981).

As described above, the static induction thyristor 100 and the process of fabricating the static induction thyristor 100 are highly advantageous. In the conventional static induction thyristor 100, however, the $P^+$ gate regions 130 are disposed only in the bottoms 44 of the recesses 40. Therefore, the thickness of depletion layers extending from the $P^+$ gate regions 130 in the direction of an anode current at the time the static induction thyristor 100 is turned off is small, posing problems with respect to dielectric strength and leakage current.

Since the thickness of depletion layers extending from the $P^+$ gate regions 130 in the direction of an anode current at the time the static induction thyristor 100 is turned off is small, it is necessary to reduce the distance between the $P^+$ gate regions 130 in order to attain desired turn-off characteristics, and hence it is necessary to reduce the distance between the recesses 40. Consequently, a product yield is low when the recesses 40 are formed in a fine pattern in the upper surface of the N⁻ substrate 10.

Reducing the distance between the recesses 40 results in a reduction in the cross-sectional area of the N⁻ substrate 10 between the recesses 40 and an increase in the electric resistance thereof. As a result, a turn-on voltage is increased, and a large current cannot flow.

SUMMARY OF THE INVENTION

It is an object of the present invention to provide a semiconductor device such as a static induction thyristor which has a high dielectric strength, suffers a small leakage current, and has a high cutoff capability, and a method of fabricating such a semiconductor device.

Another object of the present invention to provide a semiconductor device such as a static induction thyristor which can be fabricated with an improved yield at the time it is processed in a fine pattern, and a method of fabricating such a semiconductor device.

Still another object of the present invention to provide a semiconductor device such as a static induction thyristor which has a reduced turn-on voltage, allowing a large current to be flowed.

According to the present invention, there is provided a semiconductor device comprising an anode electrode, a cathode electrode, a semiconductor substrate disposed between the anode electrode and the cathode electrode, and a gate disposed in the semiconductor substrate for controlling a current flowing between the anode electrode and the cathode electrode, the semiconductor substrate having cavities defined therein and having side walls, the gate including gate regions disposed in regions of the semiconductor substrate which are exposed at the side walls of the cavities.

Preferably, the side walls extend substantially parallel to a direction in which the current flows between the anode electrode and the cathode electrode.

Preferably, the cavities have respective bottoms, the gate including other gate regions exposed at the bottoms of the cavities.

Preferably, the cavities have respective ceilings, the gate including other gate regions exposed at the ceilings of the cavities.

Preferably, the gate regions and the semiconductor substrate have pn junctions formed therebetween and including portions exposed in the cavities, and an insulating film is disposed in the cavities in covering relation to the portions of the pn junctions.

The insulating film is preferably disposed in the cavities in fully covering relation to regions of the semiconductor substrate which are exposed in the cavities.

The gate preferably includes gate electrodes disposed in the cavities, the gate electrodes being made of a good electric conductor electrically connected to the gate regions.

Preferably, an insulating film is disposed in the cavities in covering relation to the gate electrodes.

Preferably, the semiconductor substrate comprises a first semiconductor layer of one conductivity type, a second semiconductor layer of other conductivity type disposed on the first semiconductor layer, and a third semiconductor layer of the other conductivity type disposed on the second semiconductor layer, the third semiconductor layer having a higher impurity concentration than the second semiconductor layer, one of the anode electrode and the cathode electrode being disposed in electric connection to the first semiconductor layer, the other of the anode electrode and the cathode electrode being disposed in electric connection to the third semiconductor layer, the gate regions comprising a semiconductor of the one conductivity type, the cavities and the gate regions being disposed in the second semiconductor layer.

According to the present invention, the semiconductor substrate comprises a first semiconductor layer of one conductivity type, a second semiconductor layer of other conductivity type disposed over the first semiconductor layer and having a high impurity concentration, and a third semiconductor layer disposed between the first and second semiconductor layers, one of the anode electrode and the cathode electrode being disposed in electric connection to the first semiconductor layer, the other of the anode electrode and the cathode electrode being disposed in electric connection to the second semiconductor layer, the cavities being disposed as a plurality of individuals corresponding to a number of semiconductors in the third semiconductor layer, and high impurity concentration regions being disposed between the adjacent cavities.

According to the present invention, there is also provided a method of fabricating a semiconductor device, comprising the steps of preparing a first semiconductor substrate and a second semiconductor substrate, both of one conductivity type, defining recesses in a surface of the first semiconductor substrate, selectively forming gate regions of other conductivity type which are doped with an impurity, in regions of the first semiconductor substrate which are exposed at least at side walls of the recesses, with the surface of the first semiconductor substrate being exposed between the gate regions, and joining the surface of the first semiconductor substrate which is exposed between the gate regions to a surface of the second semiconductor substrate.

Preferably, the side walls of the recesses extend substantially perpendicularly to the surface of the first semiconductor substrate.

Preferably, the step of selectively forming gate regions of other conductivity type comprises the step of selectively forming gate regions of other conductivity type which are doped with an impurity, in regions of the first semiconductor substrate which are exposed at side walls and bottoms of the recesses, with the surface of the first semiconductor substrate being exposed between the gate regions.

According to the present invention, there is further provided a method of fabricating a semiconductor device, comprising the steps of preparing a first semiconductor substrate and a second semiconductor substrate, both of one conductivity type, defining recesses in a surface of the first semiconductor substrate with the surface exposed between the recesses, joining the surface of the first semiconductor substrate which is exposed between the gate regions to a surface of the second semiconductor substrate, and thereafter, forming gate regions of other conductivity type which are doped with an impurity, in regions of the first semiconductor substrate which are exposed at side walls and bottoms of the recesses, and regions of the surface of the second semiconductor substrate which are exposed in the recesses.

Preferably, after the gate regions are formed, insulating films are formed in the recesses in covering relation to the gate regions, and thereafter the surface of the first semiconductor substrate which is exposed between the gate regions is joined to the surface of the second semiconductor substrate.

Preferably, the method further comprises the step of, after the surface of the first semiconductor substrate which is exposed between the gate regions is joined to the surface of the second semiconductor substrate, forming oxide films on side walls and bottoms of the recesses and regions of the surface of the second semiconductor substrate which are exposed in the recesses.

Preferably, the method further comprises the step of, before the surface of the first semiconductor substrate which is exposed between the gate regions is joined to the surface of the second semiconductor substrate, forming gate electrodes disposed in the recesses, the gate electrodes being made of a good electric conductor electrically connected to the gate regions.

Preferably, the method further comprises the step of, before the surface of the first semiconductor substrate which is exposed between the gate regions is joined to the surface of the second semiconductor substrate, forming insulating films in the recesses in covering relation to the gate electrodes.

Preferably, the method further comprises the step of, after the surface of the first semiconductor substrate which is exposed between the gate regions is joined to the surface of the second semiconductor substrate, forming oxide films in covering relation to regions of the first semiconductor substrate which are exposed at side walls and bottoms of the recesses, regions of the surface of the second semiconductor substrate which are exposed in the recesses, and the gate electrodes.

Preferably, the method further comprises the steps of forming a first semiconductor layer of the other conductivity type on either one of another surface of the first semiconductor substrate which lies opposite to the surface thereof and another surface of the first semiconductor substrate which lies opposite to the surface thereof, forming one of an anode electrode and a cathode electrode in electric connection to the other surface of the first semiconductor substrate or the first semiconductor layer, and forming the other of the anode electrode and the cathode electrode in electric connection to the other surface of the second semiconductor substrate or the second semiconductor layer.

In the semiconductor device according to the present invention, cavities are defined in a semiconductor substrate, and gate regions are disposed in regions of the semiconductor substrate which are exposed at the side walls of the cavities.

Since an anode current flows along the side walls of the cavities, the gate regions along the side walls of the cavities are effective in increasing the length of a depletion layer which extends from the gate regions in the direction of the anode current when the semiconductor device is turned off. Therefore, the dielectric strength of the semiconductor device at the time it is turned off is increased, and a leakage current thereof is reduced. The semiconductor device thus has a high cutoff capability.

Inasmuch as the thickness of the depletion layer which extends from the gate regions in the direction of the anode current when the semiconductor device is turned off is increased, predetermined turn-off characteristics can be obtained even if the distance between the gate regions is not reduced. Consequently, it is not necessary to reduce the distance between the cavities in the semiconductor substrate. As a result, a product yield is increased when the cavities are formed in a fine pattern in the semiconductor substrate.

Since the distance between the cavities does not need to be reduced, the cross-sectional area of the semiconductor substrate between the cavities is not reduced, and the electric resistance of the semiconductor substrate between the cavities is reduced, with the result that a turn-on voltage is reduced and a large current can flow.

The side walls of the cavities are disposed substantially parallel to the direction of the anode current that flows between the anode electrode and the cathode electrode. Consequently, the depletion layer can extend uniformly over the full length of the channel between the gate regions at the time the semiconductor device is turned off. Therefore, the dielectric strength is further increased at the time the semiconductor device is turned off, and the leakage current is further reduced. The semiconductor device has a higher cutoff capability.

Because better turn-off characteristics are provided by having the side walls of the cavities disposed substantially parallel to the direction of the anode current, the distance between the cavities in the semiconductor substrate can further be increased. As a result, a product yield is further increased when the cavities are formed in a fine pattern in the semiconductor substrate.

Inasmuch as the distance between the cavities is further increased, the cross-sectional area of the semiconductor substrate between the cavities is further increased, and the electric resistance of the semiconductor substrate between the cavities is further reduced, with the result that a turn-on voltage is further reduced and a larger current can be flowed.

Because the gate regions are also disposed in those regions of the semiconductor substrate which are exposed at the bottoms of the cavities and/or the gate regions are also disposed in those regions of the semiconductor substrate which are exposed at the ceilings of the cavities, the resistance of the gate in a lateral direction is further reduced, and a maximum cutoff current is increased, allowing the semiconductor device to handle higher frequencies. The gate resistance is reduced because the gate regions are disposed in those regions of the semiconductor substrate which are exposed at the side walls of the cavities and the bottoms and/or ceilings of the cavities. As a result, the volume of the gate is reduced to increase a controlled current for thereby allowing the semiconductor device to have a higher current handling capacity.

Since the gate regions and the semiconductor substrate have pn junctions formed therebetween and including portions exposed in the cavities, and insulating films are disposed in the cavities in covering relation to the portions of the pn junctions, the dielectric strength between the gate and the cathode is reduced. Where the insulating films are preferably disposed in the cavities in fully covering relation to regions of the semiconductor substrate which are exposed in the cavities, the dielectric strength between the gate and the cathode is more reliably reduced.

Because the gate preferably includes gate electrodes disposed in the cavities, the gate electrodes being made of a good electric conductor electrically connected to the gate regions, the lateral resistance of the gate is reduced, increasing a maximum cutoff current, and a carrier withdrawal current is increased for higher-speed switching.

According to one of the methods of the present invention, a first semiconductor substrate and a second semiconductor substrate, both of one conductivity type, are prepared, recesses are defined in a surface of the first semiconductor substrate, gate regions of other conductivity type which are doped with an impurity are selectively formed in regions of the first semiconductor substrate which are exposed at least at side walls of the recesses, with the surface of the first semiconductor substrate being exposed between the gate regions, and the surface of the first semiconductor substrate which is exposed between the gate regions is joined to a surface of the second semiconductor substrate.

Since the gate regions are formed in the regions of the first semiconductor substrate which are exposed at the side walls of the recesses defined in the surface of the first semiconductor substrate, the length of a depletion layer which extends from the gate regions in the direction of the anode current when the semiconductor device is turned off. Therefore, the dielectric strength of the semiconductor device at the time it is turned off is increased, and a leakage current thereof is reduced. The semiconductor device thus has a high cutoff capability.

Inasmuch as the thickness of the depletion layer which extends from the gate regions in the direction of the anode current when the semiconductor device is turned off is increased, predetermined turn-off characteristics can be obtained even if the distance between the gate regions is not reduced. Consequently, it is not necessary to reduce the distance between the recesses in the surface of the first semiconductor substrate. As a result, a product yield is increased when the recesses are formed in a fine pattern in the surface of the first semiconductor substrate.

Since the distance between the recesses does not need to be reduced, the cross-sectional area of the first semiconductor substrate between the recesses is not reduced, and the electric resistance of the first semiconductor substrate between the recesses is reduced, with the result that a turn-on voltage is reduced and a large current can be flowed.

Furthermore, a base in which the gate regions are formed is produced by joining the first and second semiconductor substrates without epitaxial growth. Therefore, the base has uniform, high-quality crystallinity. The conductivity type of an N base, for example, between $P^+$ gate regions does not change into a P type which would otherwise be produced if an $N^-$ layer were deposited by epitaxial growth after the formation of the $P^+$ gate regions, making it impossible to control an anode current. The gate regions can be formed by doping the semiconductor substrate with a high concentration of impurity.

The epitaxial growth is required to be carried out at a high temperature of 1100° C. or more, and tends to diffuse impurities greatly. However, the semiconductor substrates can be joined by heating them to a temperature ranging from 200 to 300° C., without involving any substantial impurity diffusion. The semiconductor substrates can be joined without any pressure applied thereto, but may be joined at lower temperatures under pressure.

Where the side walls of the recesses extend substantially perpendicularly to the surface of the first semiconductor substrate, the side walls of the recesses are disposed substantially parallel to the direction of an anode current that flows between an anode electrode and a cathode electrode. Consequently, a depletion layer can extend uniformly over the full length of a channel between the gate regions at the time the semiconductor device is turned off. Therefore, the dielectric strength is further increased at the time the semiconductor device is turned off, and the leakage current is further reduced. The semiconductor device has a higher cutoff capability.

Because better turn-off characteristics are provided by having the side walls of the recesses disposed substantially perpendicularly to the surface of the first semiconductor substrate, the distance between the recesses in the first semiconductor substrate can further be increased. As a result, a product yield is further increased when the recesses are formed in a fine pattern in the surface of the first semiconductor substrate.

Inasmuch as the distance between the recesses is further increased, the cross-sectional area of the first semiconductor substrate between the recesses is further increased, and the electric resistance of the first semiconductor substrate between the recesses is further reduced, with the result that a turn-on voltage of the semiconductor device fabricated according to the method is further reduced and a larger current can be flowed.

Because the gate regions are also disposed in those regions of the first semiconductor substrate which are exposed at the bottoms of the recesses, the resistance of the gate in a lateral direction is further reduced, and a maximum cutoff current is increased, allowing the semiconductor device to handle higher frequencies. The gate resistance is reduced because the gate regions are disposed in those regions of the first semiconductor substrate which are exposed at the side walls of the recesses and the bottoms of the recesses. As a result, the volume of the gate is reduced to increase a controlled current for thereby allowing the semiconductor device to have a higher current handling capacity.

According to the other method of the present invention, a first semiconductor substrate and a second semiconductor substrate, both of one conductivity type, are prepared, recesses are defined in a surface of the first semiconductor substrate with the surface exposed between the recesses, the surface of the first semiconductor substrate which is exposed between the gate regions is joined to a surface of the second semiconductor substrate, and thereafter, gate regions of other conductivity type which are doped with an impurity, are formed in regions of the first semiconductor substrate which are exposed at side walls and bottoms of the recesses, and regions of the surface of the second semiconductor substrate which are exposed in the recesses. Therefore, the gate regions are formed in the side walls, bottoms, and ceilings of the recesses, reducing the lateral resistance of a gate, increasing a maximum cutoff current, and permitting the semiconductor device to handle higher frequencies.

After the gate regions are formed, insulating films are formed in the recesses in covering relation to the gate regions. When the surface of the first semiconductor substrate which is exposed between the gate regions is joined to the surface of the second semiconductor substrate, an impurity is prevented from being diffused from the gate regions into the joined surfaces. As a result, the turn-on voltage of the semiconductor device is lowered, and the dielectric strength between the gate and the cathode is increased.

After the surface of the first semiconductor substrate which is exposed between the gate regions is joined to the surface of the second semiconductor substrate, oxide films are formed on side walls and bottoms of the recesses and regions of the surface of the second semiconductor substrate which are exposed in the recesses. With this arrangement, pn junctions formed between the gate regions, the first semiconductor substrate, and the second semiconductor substrate are passivated, with a resultant increase in the dielectric strength between the gate and the cathode is increased.

Before the surface of the first semiconductor substrate which is exposed between the gate regions is joined to the surface of the second semiconductor substrate, gate electrodes are disposed in the recesses defined in the surface of the first semiconductor substrate, the gate electrodes being made of a good electric conductor electrically connected to the gate regions. The lateral resistance of the gate is reduced, increasing a maximum cutoff current, and a carrier withdrawal current is increased for higher-speed switching.

Since the gate electrodes are disposed in the recesses in the first semiconductor substrate before the surface of the first semiconductor substrate which is exposed between the gate regions is joined to the surface of the second semiconductor substrate, it is not necessary to form grooves of a large aspect ratio in semiconductor substrate and then form the gate electrodes in such grooves. As a result, the semiconductor substrate over the gate electrodes would not be divided by such grooves into small strips which would impose a high resistance.

The formation of the recesses in the surface of the first semiconductor substrate even with a dry etching process at a low etching rate is not time-consuming because the recesses only need to be capable of holding the gate electrodes therein.

As the gate electrodes are accommodated in the recesses defined in the surface of the first semiconductor substrate, no recesses are required to be formed in the surface of the second semiconductor substrate which is to be joined by the surface of the first semiconductor substrate, and hence the surface of the second semiconductor substrate may remain flatwise. Since no special alignment is necessary to join the surface of the first semiconductor substrate to the surface of the second semiconductor substrate, it is easy to fabricate the semiconductor device.

The gate electrodes should preferably be made of polycrystalline silicon doped with an impurity, aluminum, or a metal of high melting point such as tungsten or the like. If the gate electrodes are made of polycrystalline silicon or a metal of high melting point, then it is possible to join the first and second semiconductor substrate by way of thermal diffusion at a higher temperature. As a consequence, any disturbance of crystal lattices in the joined surfaces is minimized, resulting in good joined surfaces.

Before the surface of the first semiconductor substrate is joined to the surface of the second semiconductor substrate, insulating films are formed in the recesses in covering relation to the gate electrodes. With this arrangement, the surface of the first semiconductor substrate and the surface of the second semiconductor substrate can be kept clean at the time they are joined, and hence can be joined well.

If the gate electrodes are made of aluminum or a metal of high melting point, then the insulating films covering the gate electrodes should preferably be formed by depositing an oxide film or the like by way of chemical vapor deposition (CVD). If the gate electrodes are made of polycrystalline silicon doped with an impurity, then the insulating films may be formed by oxidizing the polycrystalline silicon, or by depositing an oxide film or the like by way of CVD.

After the surface of the first semiconductor substrate is joined to the surface of the second semiconductor substrate, oxide films are formed in covering relation to regions of the first semiconductor substrate which are exposed at side walls and bottoms of the recesses, regions of the surface of the second semiconductor substrate which are exposed in the recesses, and the gate electrodes. With this arrangement, pn junctions formed between the gate regions and the semiconductor substrates are passivated, with a resultant increase in the dielectric strength between the gate and the cathode is increased.

The oxide films should preferably be formed by thermal oxidization, with the gate electrodes being made of polycrystalline silicon doped with an impurity.

Before the surface of the first semiconductor substrate is joined to the surface of the second semiconductor substrate, a highly concentrated semiconductor region of one conductivity type which is of a higher concentration than the first semiconductor substrate may be formed in the first semiconductor substrate at its joined surface, or a highly concentrated semiconductor region of one conductivity type which is of a higher concentration than the second semiconductor substrate may be formed in the second semiconductor substrate at its joined surface for good electric connection. The highly concentrated semiconductor region has a thickness which preferably ranges from several tens Å to several hundreds Å.

It is preferable to comprise a step of disposing a plurality of high impurity concentration regions spaced apart by a predetermined interval on the surface of the first semiconductor substrate after the step of preparing the first and second semiconductor substrates.

It is preferable that the recesses are defined between the plurality of high impurity concentration regions spaced apart by the predetermined interval.

It is preferable to comprise a step of disposing a plurality of high impurity concentration regions spaced apart by a predetermined interval on the surface of the second semiconductor substrate after the step of preparing the first and second semiconductor substrates.

It is preferable that the plurality of high impurity concentration regions are disposed corresponding to the exposed surface excluding the recesses defined in the first semiconductor substrate.

The features and the methods as described above reduce the amount of power consumption and the amount of heat generation.

While only static induction thyristors will be described in the embodiments, described below, of the present invention, the basic structure thereof is equivalent to static induction transistors if anode P emitters are removed from the static induction thyristors. Therefore, persons of ordinary skill in the art will see no difficulty replacing the static induction thyristors with static induction transistors in the illustrated embodiments.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
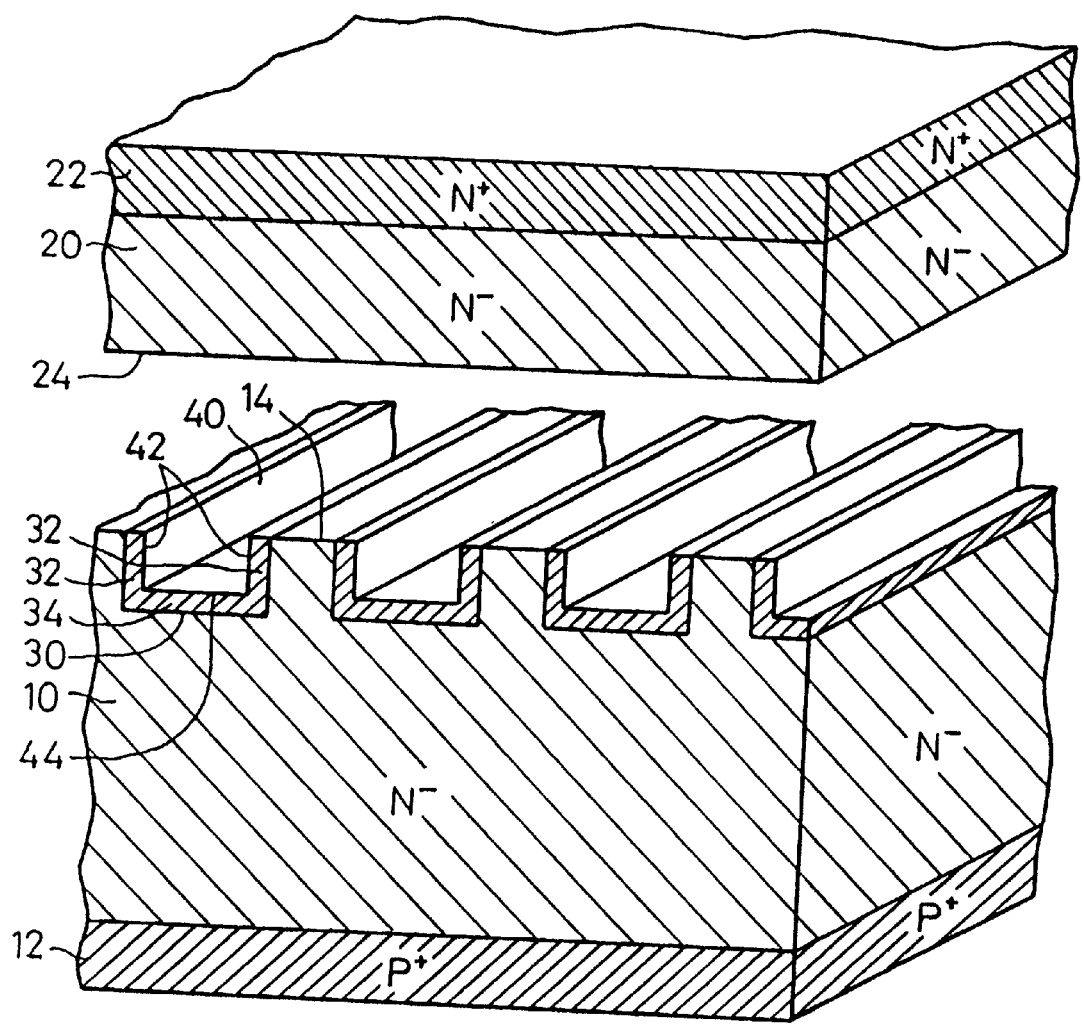
FIG. 1 is a fragmentary sectional perspective view of a static induction thyristor according to a first embodiment of the present invention, the view being also illustrative of a method of fabricating the static induction thyristor according to the first embodiment.

Similar or corresponding parts are denoted by similar or corresponding reference numerals throughout views.

1st Embodiment

Figure 2:
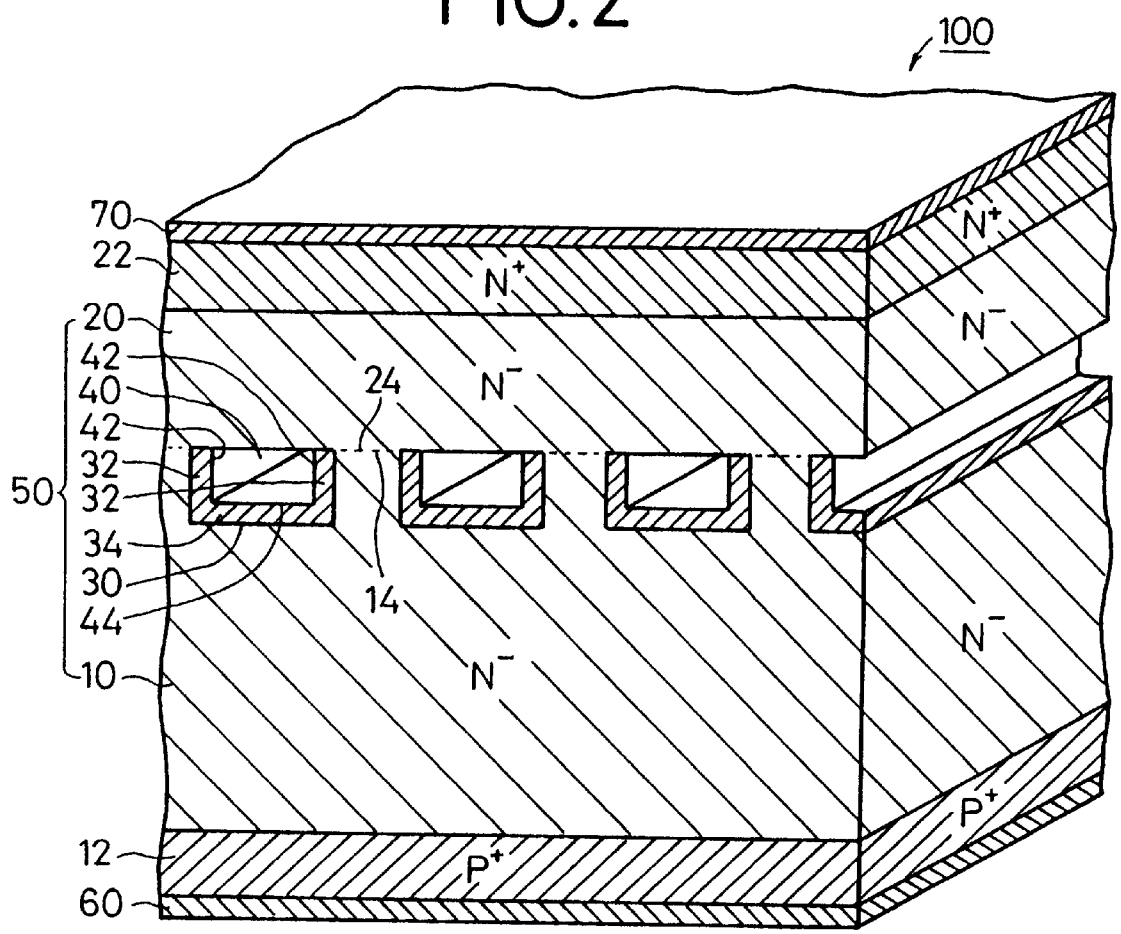
FIG. 2 is a fragmentary sectional perspective view of the static induction thyristor according to the first embodiment, the view being also illustrative of the method of fabricating the static induction thyristor according to the first embodiment.

FIGS. 1 and 2 show in fragmentary sectional perspective a static induction thyristor 100 according to a first embodiment of the present invention, the views being also illustrative of a method of fabricating the static induction thyristor according to the first embodiment.

First, as shown in FIG. 1, $N^-$ substrates 10, 20 having respective mirror-finished surfaces to be joined to each other are prepared.

Then, a $P^+$ layer 12 is formed on the lower surface of the $N^-$ substrate 10 by diffusing an impurity therein. Recesses 40 each having a width of 30 $\mu$m and a depth of 20 $\mu$m are formed at a pitch or interval of 50 $\mu$m in the upper mirror-finished surface of the $N^-$ substrate 10 by photolithography. Each of the recesses 40 has a pair of opposite side walls 42 extending substantially perpendicularly to the upper surface of the $N^-$ substrate 10. Thereafter, a P-type impurity of boron is selectively diffused to form $P^+$ gate regions 30 selectively in regions of the $N^-$ substrate 10 which are exposed at the side walls 42 and bottoms 44 of the recesses 40. The $P^+$ gate regions 30 thus formed are composed of side gate regions 32 and bottom gate regions 34. The boron is diffused at a temperature ranging from 1050 to 1200° C. in an atmosphere of $BBr_3+O_2$. When the boron is diffused, oxide films are formed on the side walls 42 and bottoms 44 of the recesses 40, but are omitted from illustration.

Then, an $N^-$ layer 22 is formed on the upper surface of the $N^-$ substrate 20 by diffusing an impurity therein.

Then, the $N^-$ substrates 10, 20 are ultrasonically cleaned in an aqueous solution of sulfuric acid and hydrogen peroxide to remove organic materials and metals therefrom.

The $N^-$ substrates 10, 20 are thereafter cleaned by pure water, and then dried by a spinner at a room temperature.

Then, as shown in FIG. 2, while lands 14 between the recesses 40 in the upper surface of the $N^-$ substrate 10 are being held against a lower mirror-finished surface 24 of the $N^-$ substrate 20, the $N^-$ substrates 10, 20 are joined to each other by heating them at 800° C. in a hydrogen atmosphere.

Thereafter, an anode electrode 60 and a cathode electrode 70 are formed respectively on the lower surface of the $P^+$ layer 12 which is formed on the lower surface of the $N^-$ substrate 10 and the upper surface of the $N^+$ layer 22 which is formed on the upper surface of the $N^-$ substrate 20.

In the static induction thyristor 100 thus fabricated, the $P^+$ layer 12 functions as an anode, the $N^+$ layer 22 as a cathode, the $N^-$ substrates 10, 20 as an N base 50, and the $P^+$ gate regions 30 as a gate for controlling an anode current flowing between the anode electrode 60 and the cathode electrode 70.

According to the first embodiment, the recesses 40 are formed in the upper surface of the $N^-$ substrate 10, with cavities being defined in the N base 50 by the recesses 40 and the lower surface 24 of the $N^-$ substrate 20, and the side gate regions 32 are disposed in those regions of the $N^-$ substrate 10 which are exposed on the side walls 42 of the recesses 40. Since an anode current flows along the side walls 42 of the recesses 40, the side gate regions 32 along the side walls 42 of the recesses 40 are effective in increasing the length of a depletion layer which extends from the gate regions 30 in the direction of the anode current when the static induction thyristor 100 is turned off. Therefore, the dielectric strength of the static induction thyristor 100 at the time it is turned off is increased, and a leakage current thereof is reduced. The static induction thyristor 100 thus has a high cutoff capability.

Inasmuch as the thickness of the depletion layer which extends from the gate regions 30 in the direction of the anode current when the static induction thyristor 100 is turned off is increased, predetermined turn-off characteristics can be obtained even if the distance between the gate regions 30 is not reduced. Consequently, it is not necessary to reduce the distance between the recesses 40 in the $N^-$ substrate 10. As a result, a product yield is increased when the recesses 40 are formed in a fine pattern in the upper surface of the $N^-$ substrate 10.

Since the distance between the recesses 40 does not need to be reduced, the cross-sectional area of the $N^-$ substrate 10 between the recesses 40 is not reduced, and the electric resistance of the $N^-$ substrate 10 between the recesses 40 is reduced, with the result that a turn-on voltage is reduced and a large current can be flowed.

The side walls 42 of the recesses 40 are disposed substantially parallel to the direction of the anode current that flows between the anode electrode 60 and the cathode electrode 70. Therefore, the side gate regions 32 are also disposed substantially parallel to the direction of the anode current. Consequently, the depletion layer can extend uniformly over the full length of the channel between the gate regions 30 at the time the static induction thyristor 100 is turned off. Therefore, the dielectric strength is further increased at the time the static induction thyristor 100 is turned off, and the leakage current is further reduced. The static induction thyristor 100 has a higher cutoff capability.

Because better turn-off characteristics are provided by having the side walls 42 of the recesses 40 disposed substantially parallel to the direction of the anode current, the distance between the recesses 40 in the $N^-$ substrate 10 can further be increased. As a result, a product yield is further increased when the recesses 40 are formed in a fine pattern in the upper surface of the $N^-$ substrate 10.

Inasmuch as the distance between the recesses 40 is further increased, the cross-sectional area of the $N^-$ substrate 10 between the recesses 40 is further increased, and the electric resistance of the $N^-$ substrate 10 between the recesses 40 is further reduced, with the result that a turn-on voltage is further reduced and a larger current can be flowed.

Because the bottom gate regions 34 are disposed in those regions of the $N^-$ substrate 10 which are exposed at the bottoms 44 of the recesses 40, the resistance of the gate in a lateral direction is further reduced, and a maximum cutoff current is increased, allowing the static induction thyristor 100 to handle higher frequencies.

The gate resistance is reduced because the side gate regions 32 and the bottom gate regions 34 are disposed in those regions of the $N^-$ substrate 10 which are exposed at the side walls 42 of the recesses 40 and those regions of the $N^-$ substrate 10 which are exposed at the bottoms 44 of the recesses 40. As a result, the volume of the gate is reduced to increase a controlled current for thereby allowing the static induction thyristor 100 to have a higher current handling capacity.

Because the N base 50 in which the $P^+$ gate regions 30 are disposed is produced by joining the $N^-$ substrates 10, 20, the N base 50 has uniform, high-quality crystallinity. The conductivity type of the N base 50 between the $P^+$ gate regions 30 does not change into a P type which would otherwise be produced if an $N^-$ layer were deposited by epitaxial growth after the formation of the $P^+$ gate regions 30, making it impossible to control an anode current. The $P^+$ gate regions 30 can be formed by doping the $N^-$ substrate 10 with a high concentration of boron.

Figure 3:
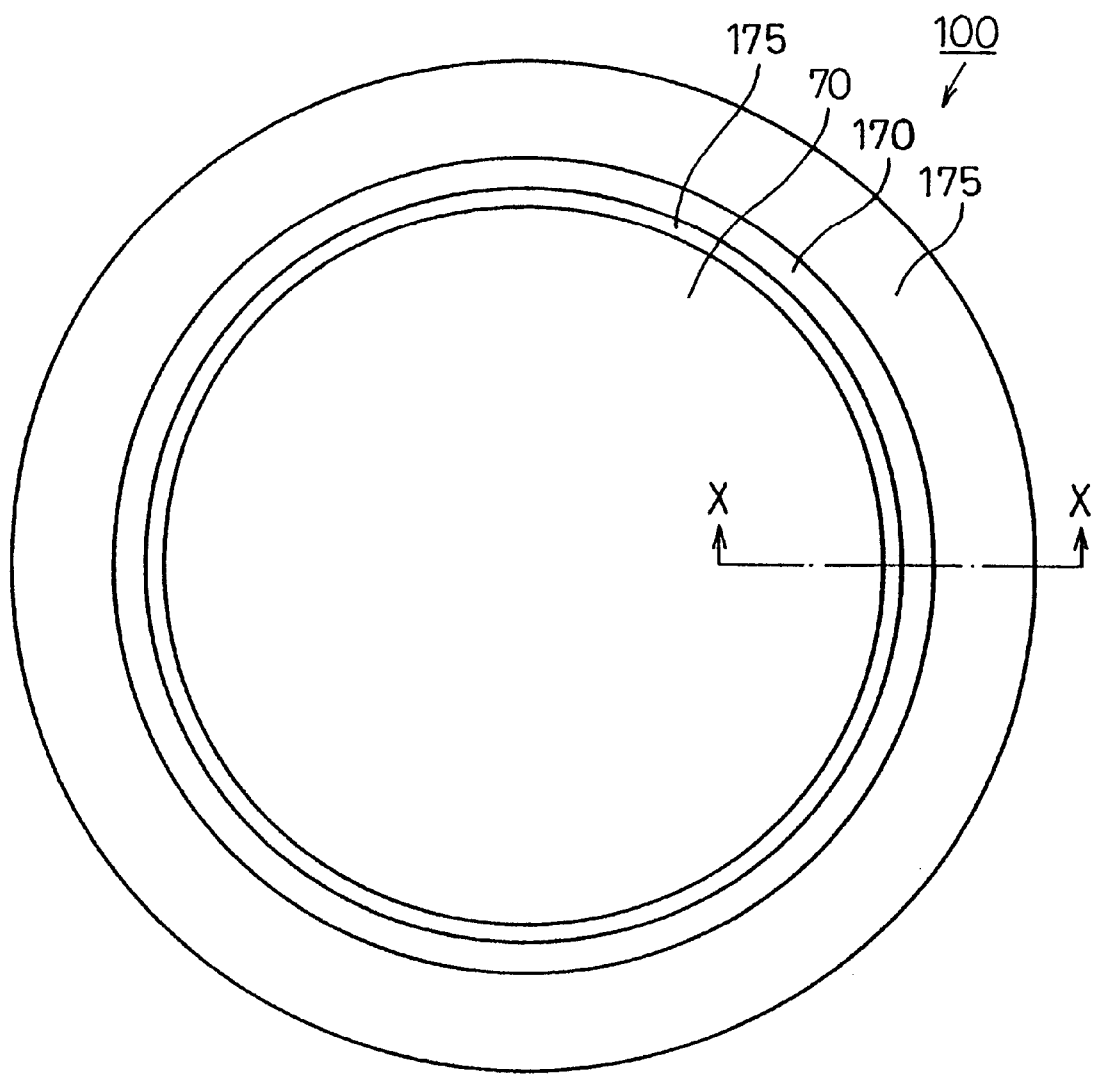
FIG. 3 is a plan view of the static induction thyristor according to the first embodiment, the view being also illustrative of the method of fabricating the static induction thyristor according to the first embodiment.
Figure 4:
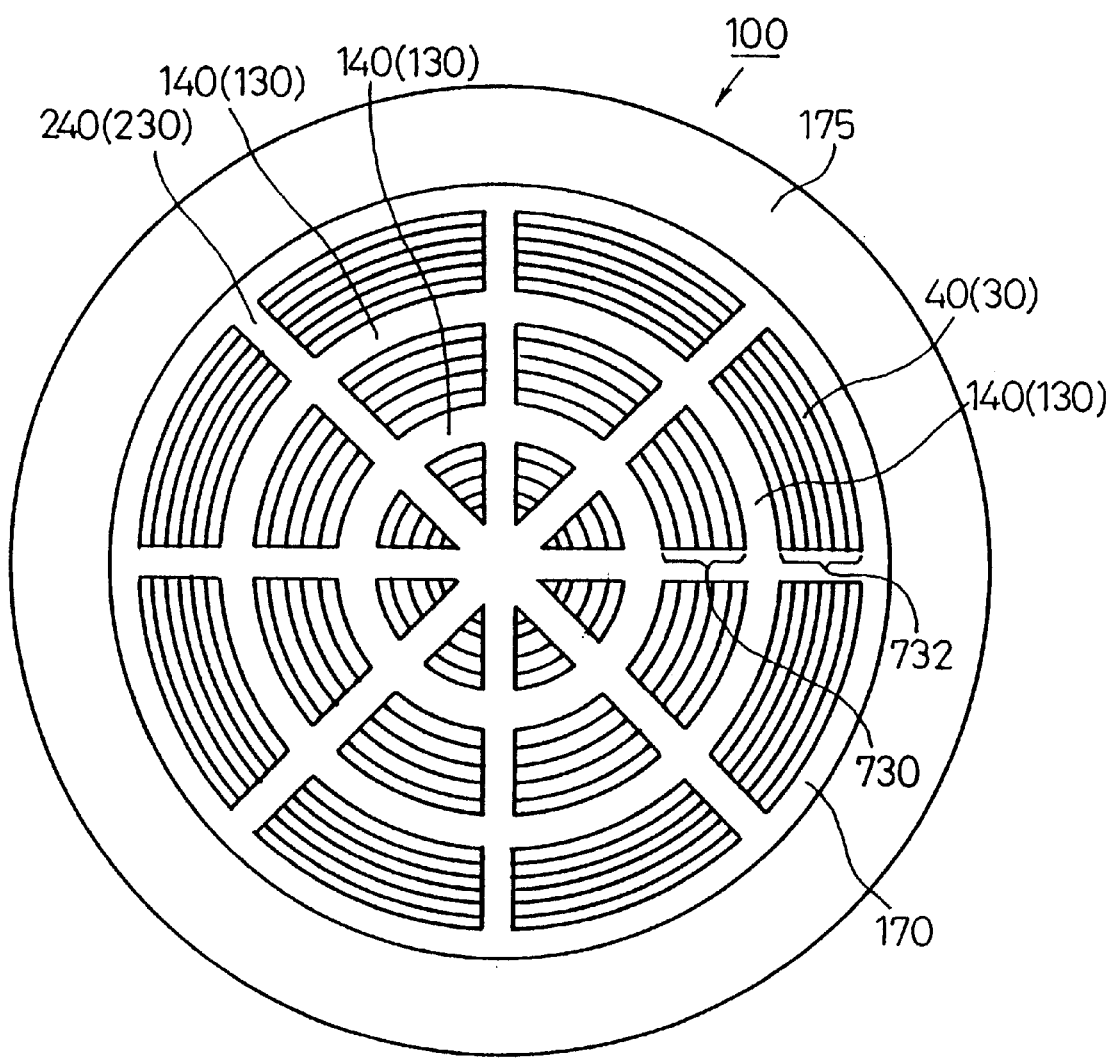
FIG. 4 is a plan view of the static induction thyristor according to the first embodiment, the view being also illustrative of the method of fabricating the static induction thyristor according to the first embodiment.
Figure 5:
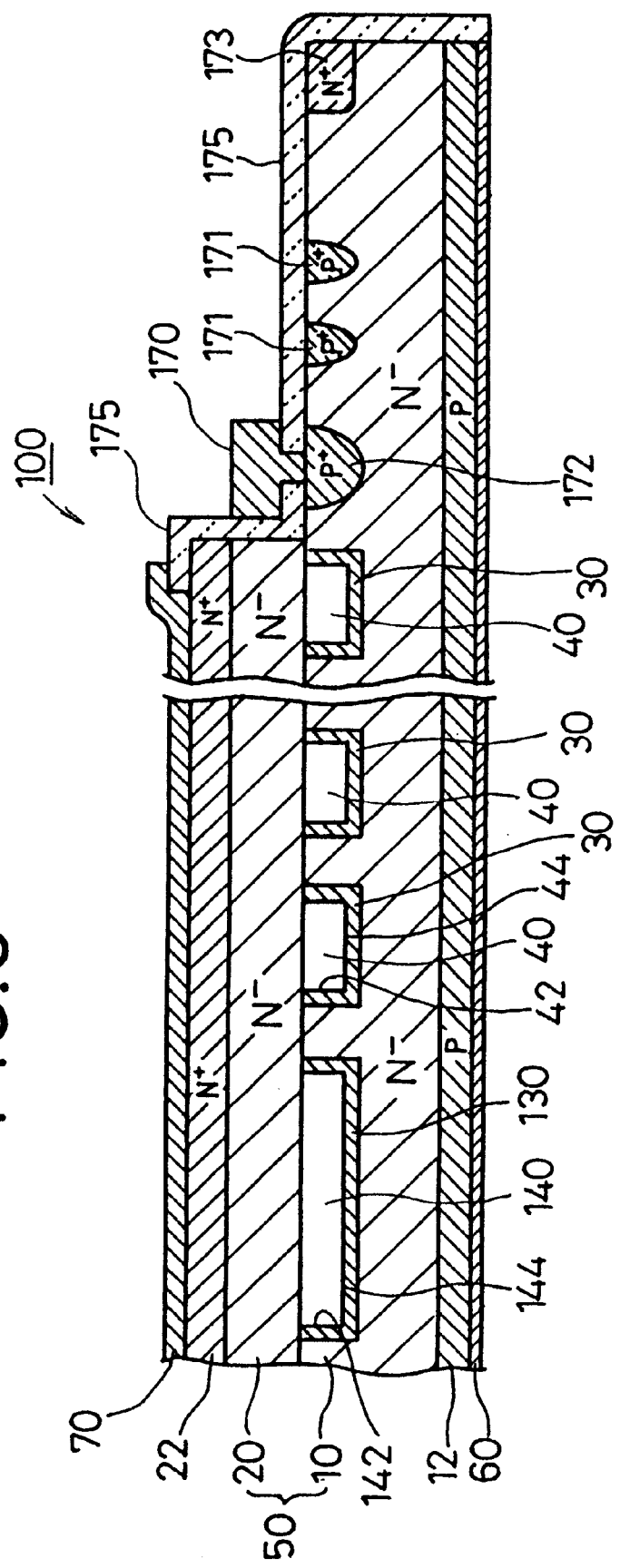
FIG. 5 is a cross-sectional view taken along line X—X of FIG. 3.

FIG. 3 shows in plan the static induction thyristor 100 according to the first embodiment in its entirety. FIG. 4 shows in plan the static induction thyristor 100 with the cathode electrode 70, the $N^+$ layer 22, and the $N^-$ substrate 20 omitted from illustration. FIG. 5 shows the static induction thyristor 100 fragmentarily in cross section taken along line X—X of FIG. 3.

Two guard rings 171 are disposed in an outer circumferential region of the $N^-$ substrate 10 to reduce an electric field concentration, and an $N^+$ channel stopper 173 is disposed in an outermost circumferential region of the $N^-$ substrate 10 to prevent a depletion layer from spreading to the outer end of the $N^-$ substrate 10. The outer guard ring 171 and the channel stopper 173 are spaced from each other by a distance that is equal to or greater than the thickness of the $N^-$ substrate 10.

The $N^-$ substrate 10 has an outer circumferential surface covered with an insulating layer 175 of $SiO_2$. The insulating layer 175 is also disposed on side walls of the $N^-$ substrate 20 and the $N^+$ layer 22, and extends to a circumferential region of the upper surface of the $N^+$ layer 22. The cathode electrode 70 is disposed on the $N^+$ layer 22 and has a circumferential region extending over the insulating layer 175 on the circumferential region of the upper surface of the $N^+$ layer 22.

An annular gate electrode lead-out layer 170 is disposed on the upper surface of the $N^-$ substrate 10 radially inwardly of the guard rings 171, and an annular P+ layer 172 is disposed in the upper surface of the N− substrate 10 underneath the annular gate electrode lead-out layer 170 in electrical connection thereto. The annular P+ layer 172 has a depth which is the same as the depth of the guard rings 171. The annular gate electrode lead-out layer 170 is connected to an external lead (not shown). The annular gate electrode lead-out layer 170 is formed as follows: After the N− substrate 10 and the N− substrate 20 are joined to each other, a circumferential region of the N− substrate 20 is etched away, exposing the surface of a circumferential region of the N− substrate 10, and then the insulating layer 175 is deposited. Thereafter, the annular gate electrode lead-out layer 170 is deposited on the insulating layer 175.

Wide recesses (cavities) 140 each having a width of 100 μm and wide gate regions 130 that are disposed in those regions of the N− substrate 10 which are exposed at side walls 142 and bottoms 144 of the recesses 140 are formed concentrically in the upper surface of the N− substrate 10 which is disposed radially inwardly of the annular gate electrode lead-out layer 170. While only two recesses 140 and two wide gate regions 130 are shown in FIG. 4, 20–30 of these recesses 140 and wide gate regions 130 are actually formed in the N− substrate 10.

Narrow recesses 40 each having a width of 30 μm are formed concentrically in the upper surface of the N− substrate 10 at a region 730 between the wide recesses 140 and at a region 732 between the outermost wide recess 140 and the annular gate electrode lead-out layer 170. While only several recesses 40 are shown in FIG. 4, 50–100 of these recesses 40 are actually formed in the N− substrate 10 at the regions 730, 732. The P+ gate regions 90 are concentrically formed in those regions of the N− substrate 10 which are exposed at the side walls 42 and bottoms 44 of the narrow recesses 40.

The gate regions 30, the gate regions 130, and the annular gate electrode lead-out layer 170 which are disposed concentrically are interconnected by radial wide gate regions 230. The wide gate regions 230 are formed by defining radial wide recesses 240 in the upper surface of the N− substrate 10 and forming P+ regions in those regions of the N− substrate 10 which are exposed at the side walls and bottoms of the wide recesses 240. The concentric wide gate regions 130 and the radial gate regions 230 are effective in interconnecting the narrow gate regions 30 and the annular gate electrode lead-out layer 170 with a low resistance.

The wide gate regions 130, the wide gate regions 230, the wide recesses 140, the wide recesses 240, the annular gate electrode lead-out layer 170, the P+ layer 172 underneath the annular gate electrode lead-out layer 170, the guard rings 171, the channel stopper 173, the insulating layer 175, and the cathode electrode 70 are not limited to the specific structural details in this embodiment, but may be incorporated in semiconductor devices according to other embodiments described later on.

In the first embodiment, the N− substrates 10, 20 are joined to each other by heating them at 800° C. However, the N− substrates 10, 20 may be joined at 400° C. or higher. If the N− substrates 10, 20 were joined at a temperature higher than 1100° C., then the impurity of the P+ gate regions 30 would be diffused into the N− substrates 10, 20, tending to adversely affect the thyristor characteristics. More preferably, the N− substrates 10, 20 should be joined to each other at a temperature ranging from 700 to 1100° C. under a normal pressure for reducing thermal diffusion of the impurity and minimizing strains of the joined crystal lattices.

In the first embodiment, the N− substrates 10, 20 are joined to each other without any pressure imposed on both sides thereof. However, it is preferable to join the N− substrates 10, 20 to each other while imposing a pressure on both sides thereof because the temperature at which they are joined can be lowered, thermal diffusion of the impurity is reduced, and non-contact areas are reduced. The pressure applied should preferably range from 0.1 kg/cm² to 100 kg/cm². If the pressure were lower than 0.1 kg/cm², then the N− substrates 10, 20 would not sufficiently be held against each other. If the pressure were higher than 100 kg/cm², then the N− substrates 10, 20 would be positionally displaced due to deformations. The temperature at which the N− substrates 10, 20 are to be joined while under pressure should preferably range from 400 to 1100° C., and more preferably range from 500 to 1000° C. because the temperature is lowered by the pressure applied to the N− substrates 10, 20.

2nd Embodiment

Figure 6:
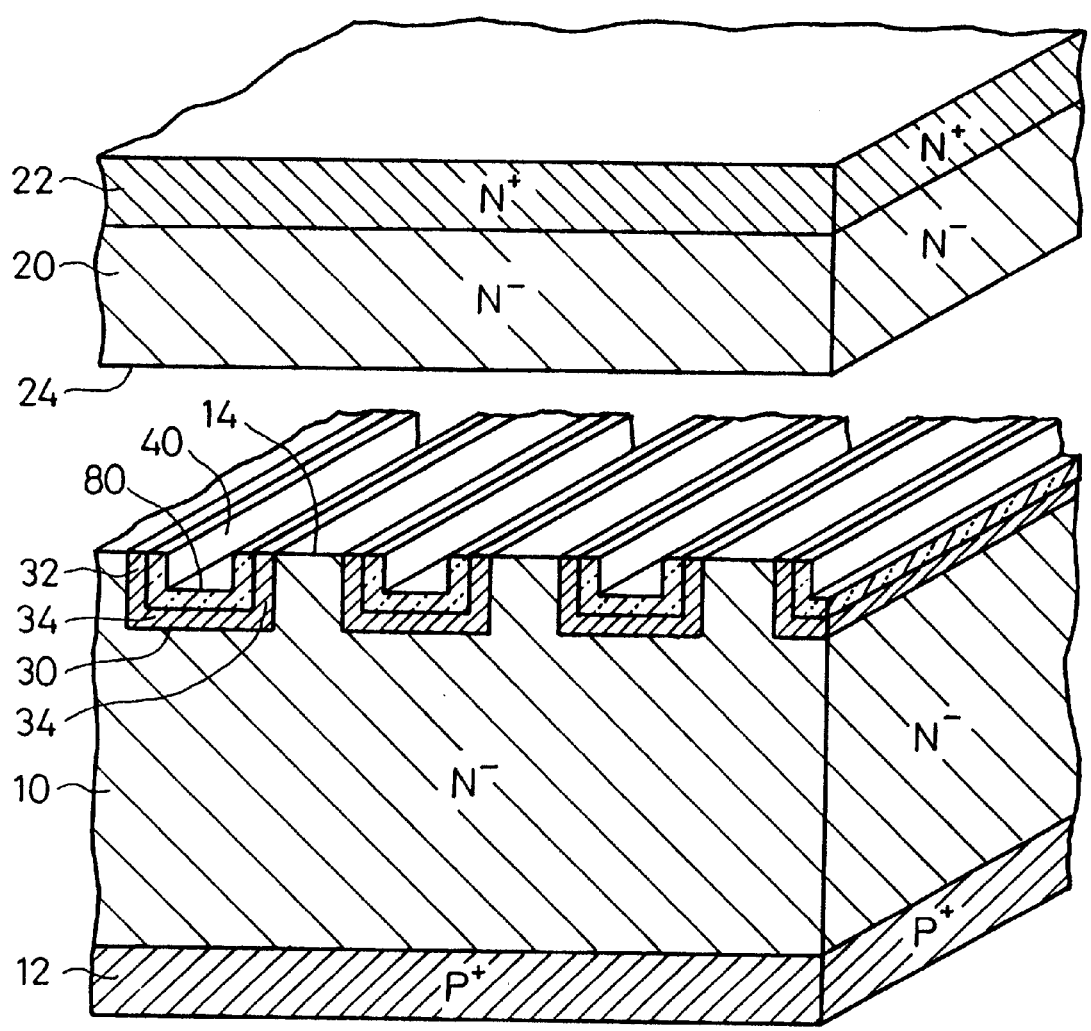
FIG. 6 is a fragmentary sectional perspective view of a static induction thyristor according to a second embodiment of the present invention, the view being also illustrative of a method of fabricating the static induction thyristor according to the second embodiment.
Figure 7:
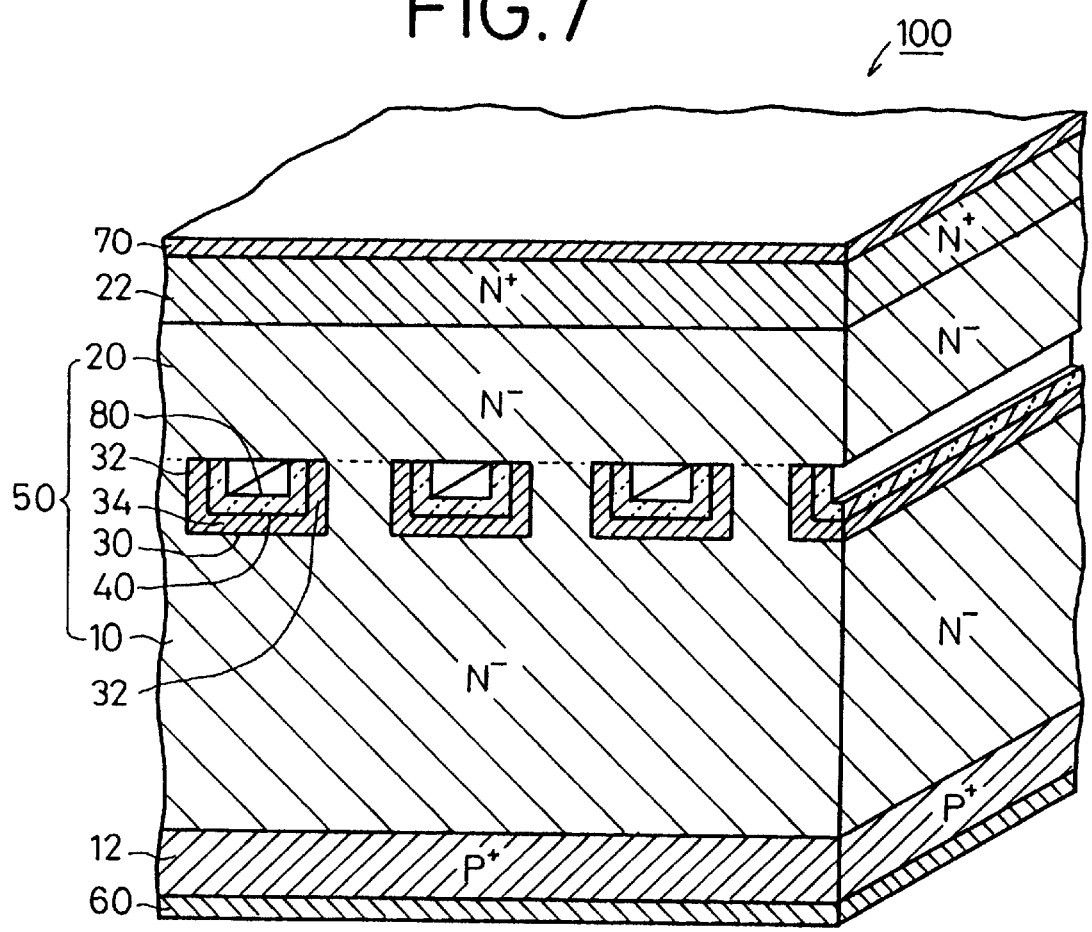
FIG. 7 is a fragmentary sectional perspective view of the static induction thyristor according to the second embodiment, the view being also illustrative of the method of fabricating the static induction thyristor according to the second embodiment.

FIGS. 6 and 7 show in fragmentary sectional perspective a static induction thyristor 100 according to a second embodiment of the present invention, the views being also illustrative of a method of fabricating the static induction thyristor according to the second embodiment.

The static induction thyristor 100 according to the second embodiment differs from the static induction thyristor 100 according to the first embodiment in that, after the gate regions 30 are formed, oxide films 80 are formed in the respective recesses 40 in covering relation to the gate regions 30, and thereafter, the lands 14 of the N− substrate 10 between the recesses 40 and the lower surface 24 of the N− substrate 20 are joined to each other. The other details of the static induction thyristor 100 and the method of fabricating the static induction thyristor 100 according to the second embodiment are the same as those of the static induction thyristor 100 according to the first embodiment.

According to the second embodiment, as described above, the oxide films 80 are formed in the respective recesses 40 in covering relation to the gate regions 30, and thereafter, the lands 14 of the N− substrate 10 between the recesses 40 and the lower surface 24 of the N− substrate 20 are joined to each other. Therefore, when the lands 14 of the N− substrate 10 between the recesses 40 and the lower surface 24 of the N− substrate 20 are joined to each other, the impurity of the gate regions 30 is prevented from being diffused into the joined surfaces. As a result, a turn-on voltage is lowered, and the dielectric strength between the gate and the cathode is increased. In the second embodiment, after the gate regions 30 are formed, an oxide film is formed on the upper surface of the N− substrate 10 by thermally oxidizing the N− substrate 10, and thereafter the upper surface of the N− substrate 10 is ground to define the oxide films 80.

3rd Embodiment

FIGS. 8 through 11 show in fragmentary sectional perspective a static induction thyristor 100 according to a third embodiment of the present invention, the views being also illustrative of a method of fabricating the static induction thyristor according to the third embodiment.

Figure 8:
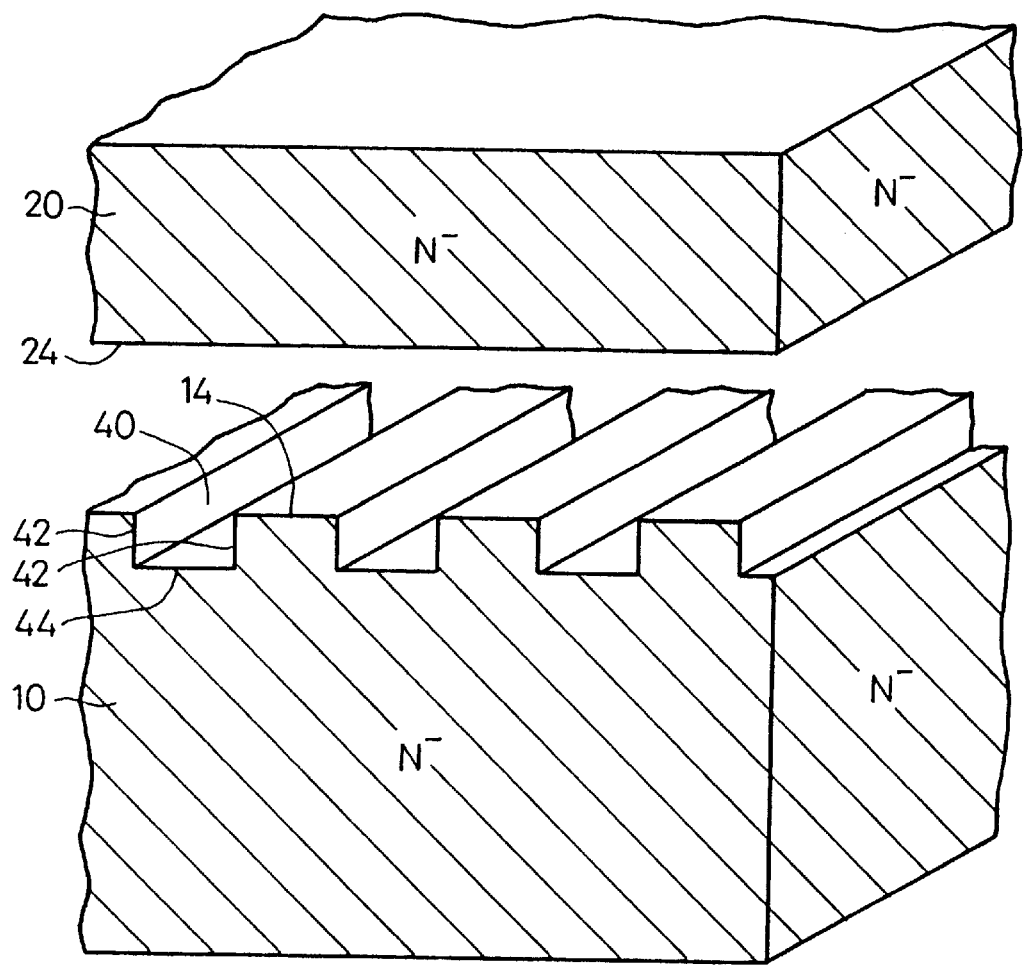
FIG. 8 is a fragmentary sectional perspective view of a static induction thyristor according to a third embodiment of the present invention, the view being also illustrative of a method of fabricating the static induction thyristor according to the third embodiment.

First, as shown in FIG. 8, N− substrates 10, 20 having respective mirror-finished surfaces to be joined to each other are prepared.

Then, recesses 40 each having a width of 40 μm and a depth of 20 μm are formed at a pitch or interval of 60 μm in the upper mirror-finished surface of the N− substrate 10 by photolithography.

Then, the N− substrates 10, 20 are ultrasonically cleaned in an aqueous solution of sulfuric acid and hydrogen peroxide to remove organic materials and metals therefrom.

The N⁻ substrates 10, 20 are thereafter cleaned by pure water, and then dried by a spinner at room temperature.

Figure 9:
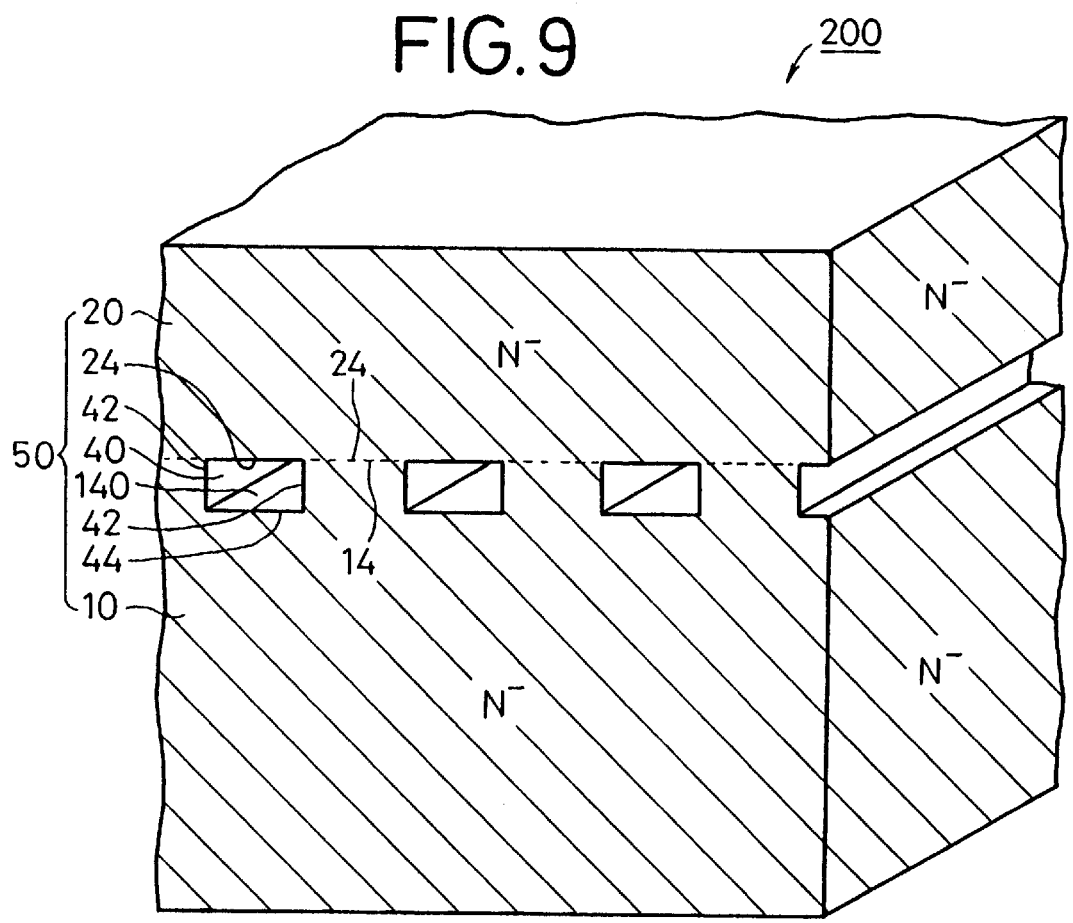
FIG. 9 is a fragmentary sectional perspective view of the static induction thyristor according to the third embodiment, the view being also illustrative of the method of fabricating the static induction thyristor according to the third embodiment.

Then, as shown in FIG. 9, while lands 14 between the recesses 40 in the upper surface of the N⁻ substrate 10 are being held against a lower mirror-finished surface 24 of the N⁻ substrate 20, the N⁻ substrates 10, 20 are joined to each other by heating them at 800° C. in a hydrogen atmosphere, thereby providing a joined semiconductor substrate assembly 200 composed of an N base 50. Recesses 140 are defined in the N base 50 by the recesses 40 and the lower surface 24 of the N⁻ substrate 20.

Figure 10:
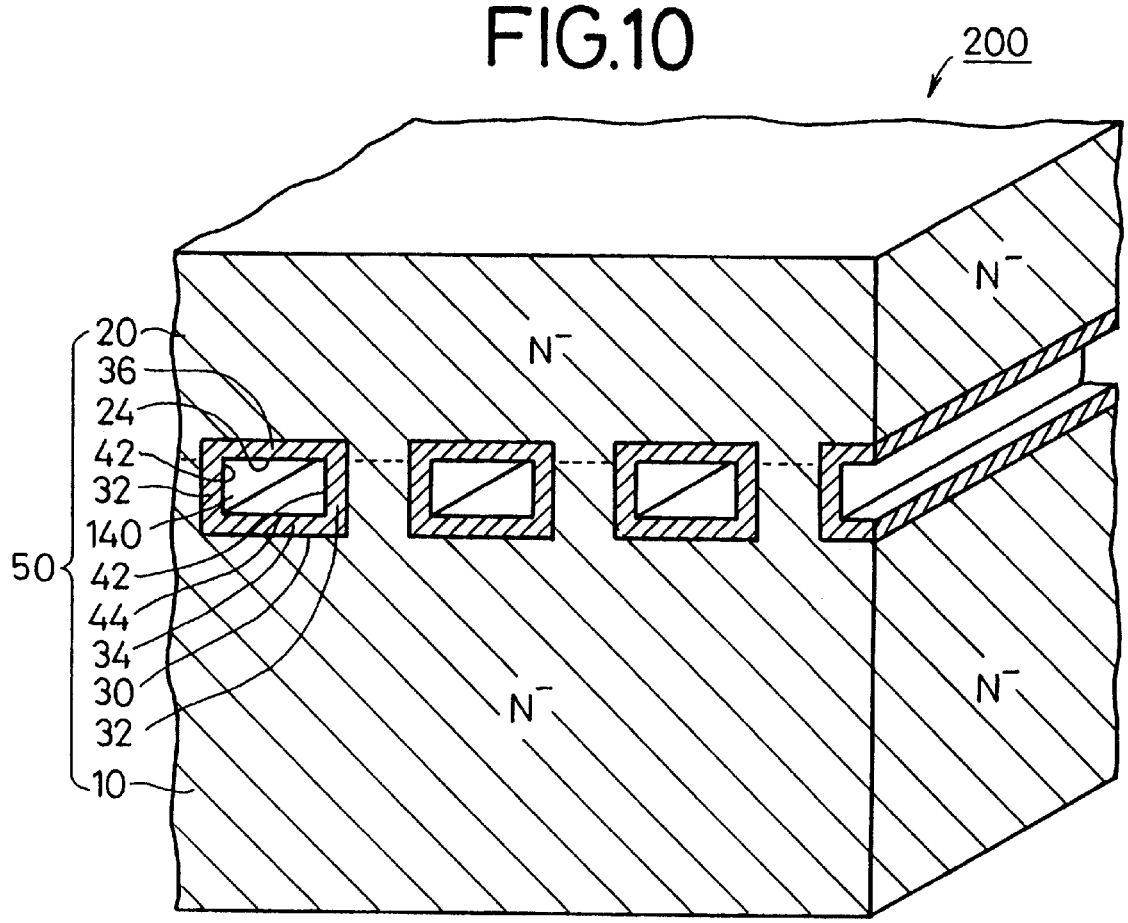
FIG. 10 is a fragmentary sectional perspective view of the static induction thyristor according to the third embodiment, the view being also illustrative of the method of fabricating the static induction thyristor according to the third embodiment.

Thereafter, as shown in FIG. 10, a P-type impurity of boron is selectively diffused to form P⁺ gate regions 30 selectively in regions of the N⁻ substrate 10 which are exposed at the side walls 42 and bottoms 44 of the recesses 40 and regions of the lower surface 24 of the N⁻ substrate 20 which are exposed in the recesses 140. The P⁺ gate regions 30 thus formed are composed of side gate regions 32, bottom gate regions 34, and ceiling gate regions 36. The boron is diffused at a temperature ranging from 1050 to 1200° C. in an atmosphere of $BBr_3+O_2$. When the boron is diffused, oxide films are formed on the side walls 42 and bottoms 44 of the recesses 40 and the lower surface 24 of the N⁻ substrate 20 which is exposed in the recesses 140, but are omitted from illustration.

Figure 11:
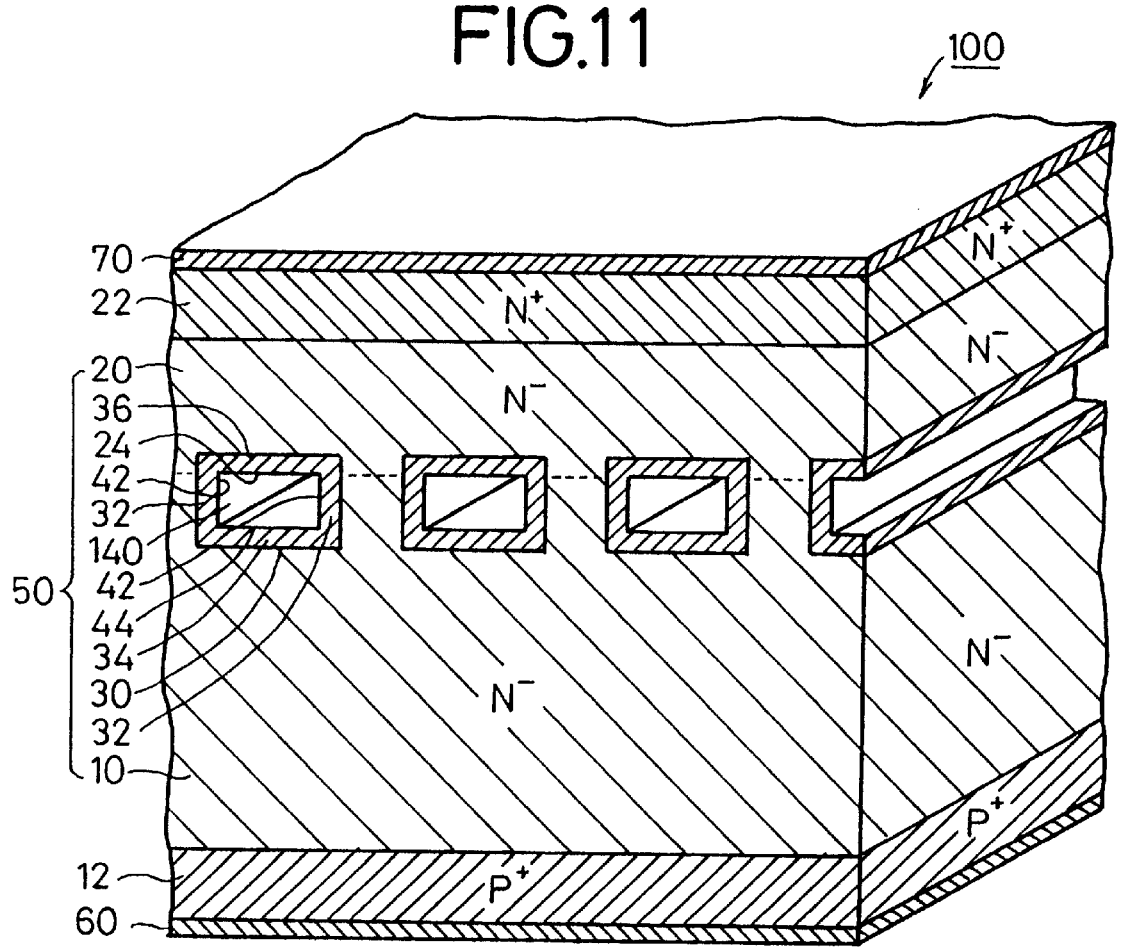
FIG. 11 is a fragmentary sectional perspective view of the static induction thyristor according to the third embodiment, the view being also illustrative of the method of fabricating the static induction thyristor according to the third embodiment.

Then, as shown in FIG. 11, a P⁺ layer 12 is formed on the lower surface of the N⁻ substrate 10 by diffusing an impurity therein, and an N⁺ layer 22 is formed on the upper surface of the N⁻ substrate 20 by diffusing an impurity therein.

Thereafter, an anode electrode 60 and a cathode electrode 70 are formed respectively on the lower surface of the P⁺ layer 12 which is formed on the lower surface of the N⁻ substrate 10 and the upper surface of the N⁺ layer 22 which is formed on the upper surface of the N⁻ substrate 20.

In the static induction thyristor 100 thus fabricated, the P⁺ layer 12 functions as an anode, the N⁺ layer 22 as a cathode, the N⁻ substrates 10, 20 as the N base 50, and the P⁺ gate regions 30 which are composed of the side gate regions 32, the bottom gate regions 34, and the ceiling gate regions 36, as a gate for controlling an anode current flowing between the anode electrode 60 and the cathode electrode 70.

In the third embodiment, since the P⁺ gate regions 30 are composed of the side gate regions 32, the bottom gate regions 34, and the ceiling gate regions 36, the lateral gate resistance is smaller and the maximum cutoff current is higher, allowing the static induction thyristor 100 to handle higher frequencies, than the static induction thyristors 100 according to the first and second embodiments in which the P⁺ gate regions 30 are composed of the side gate regions 32 and the bottom gate regions 34.

4th Embodiment

Figure 12:
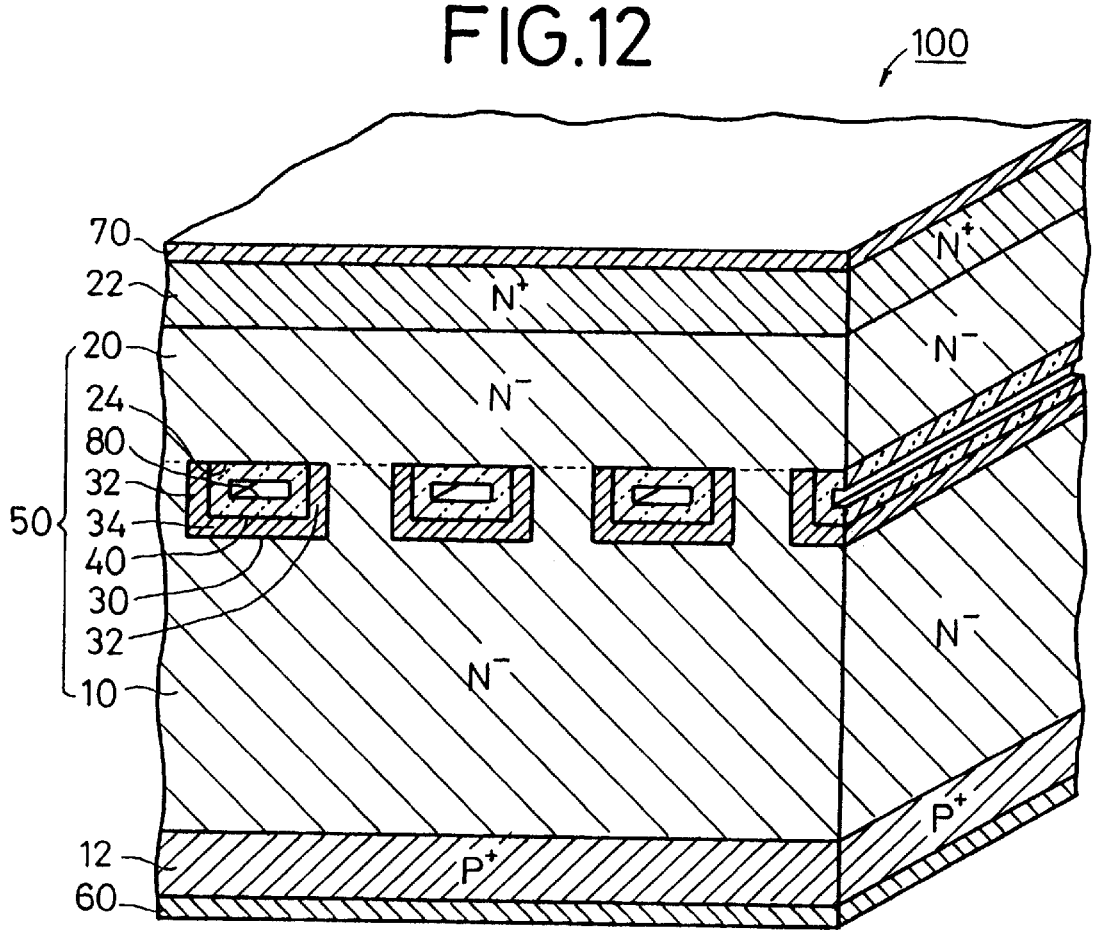
FIG. 12 is a fragmentary sectional perspective view of a static induction thyristor according to a fourth embodiment of the present invention, the view being also illustrative of a method of fabricating the static induction thyristor according to the fourth embodiment.

FIG. 12 shows in fragmentary sectional perspective a static induction thyristor 100 according to a fourth embodiment of the present invention, the view being also illustrative of a method of fabricating the static induction thyristor according to the fourth embodiment.

In the fourth embodiment, after the N⁻ substrates 10, 20 are joined to each other, they are thermally oxidized to cover the side gate regions 32, the bottom gate regions 34, and those regions of the lower surface 24 of the N⁻ substrate 20 which are exposed in the recesses 40, with oxide films 80. Thereafter, the anode electrode 60 and the cathode electrode 70 are formed respectively on the lower surface of the P⁺ layer 12 which is formed on the lower surface of the N⁻ substrate 10 and the upper surface of the N⁺ layer 22 which is formed on the upper surface of the N⁻ substrate 20. The other details of the static induction thyristor 100 and the method of fabricating the static induction thyristor 100 according to the fourth embodiment are the same as those of the static induction thyristor 100 according to the first embodiment.

According to the fourth embodiment, the dielectric strength between the gate and the cathode is increased because the pn junction is passivated by the oxide film 80.

5th Embodiment

Figure 13:
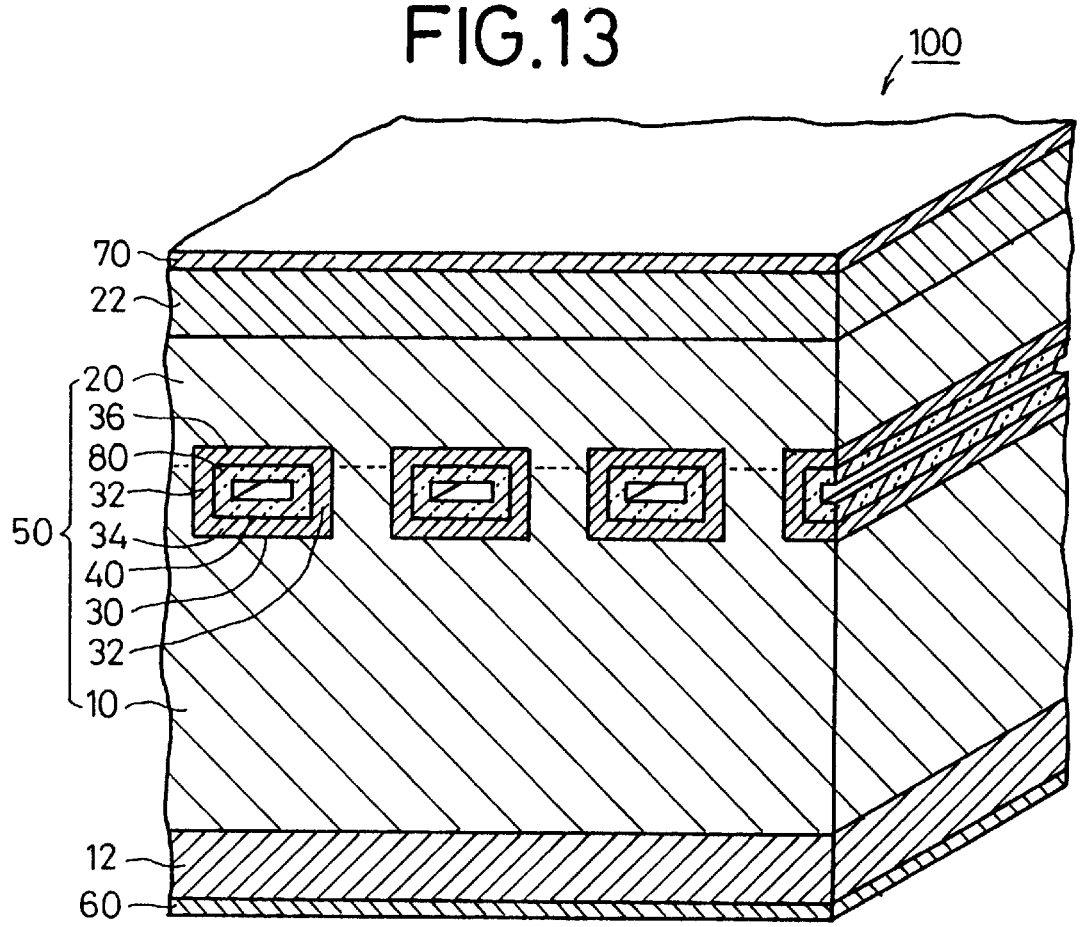
FIG. 13 is a fragmentary sectional perspective view of a static induction thyristor according to a fifth embodiment of the present invention, the view being also illustrative of a method of fabricating the static induction thyristor according to the fifth embodiment.

FIG. 13 shows in fragmentary sectional perspective a static induction thyristor 100 according to a fifth embodiment of the present invention, the view being also illustrative of a method of fabricating the static induction thyristor according to the fifth embodiment.

The static induction thyristor 100 according to the fifth embodiment differs from the static induction thyristor 100 according to the third embodiment in that the N⁻ substrates 10, 20 are joined to each other, providing a joined semiconductor substrate assembly composed of an N base 50, and then the P⁺ gate regions 30 which are composed of the side gate regions 32, the bottom gate regions 34, and the ceiling gate regions 36 are formed, and thereafter, the N⁻ substrates 10, 20 are thermally oxidized to cover the side gate regions 32, the bottom gate regions 34, and the ceiling gate regions 36 with an oxide film, after which the P⁺ layer 12 is formed on the lower surface of the N⁻ substrate 10 and the N⁺ layer 22 is formed on the upper surface of the N⁻ substrate 20, and then the anode electrode 60 and the cathode electrode 70 are formed respectively on the P⁺ layer 12 and the N⁺ layer 22. The other details of the static induction thyristor 100 and the method of fabricating the static induction thyristor 100 according to the fifth embodiment are the same as those of the static induction thyristor 100 according to the third embodiment.

According to the fifth embodiment, the dielectric strength between the gate and the cathode is also increased because the pn junction is passivated by the oxide film 80.

6th Embodiment

Figure 14:
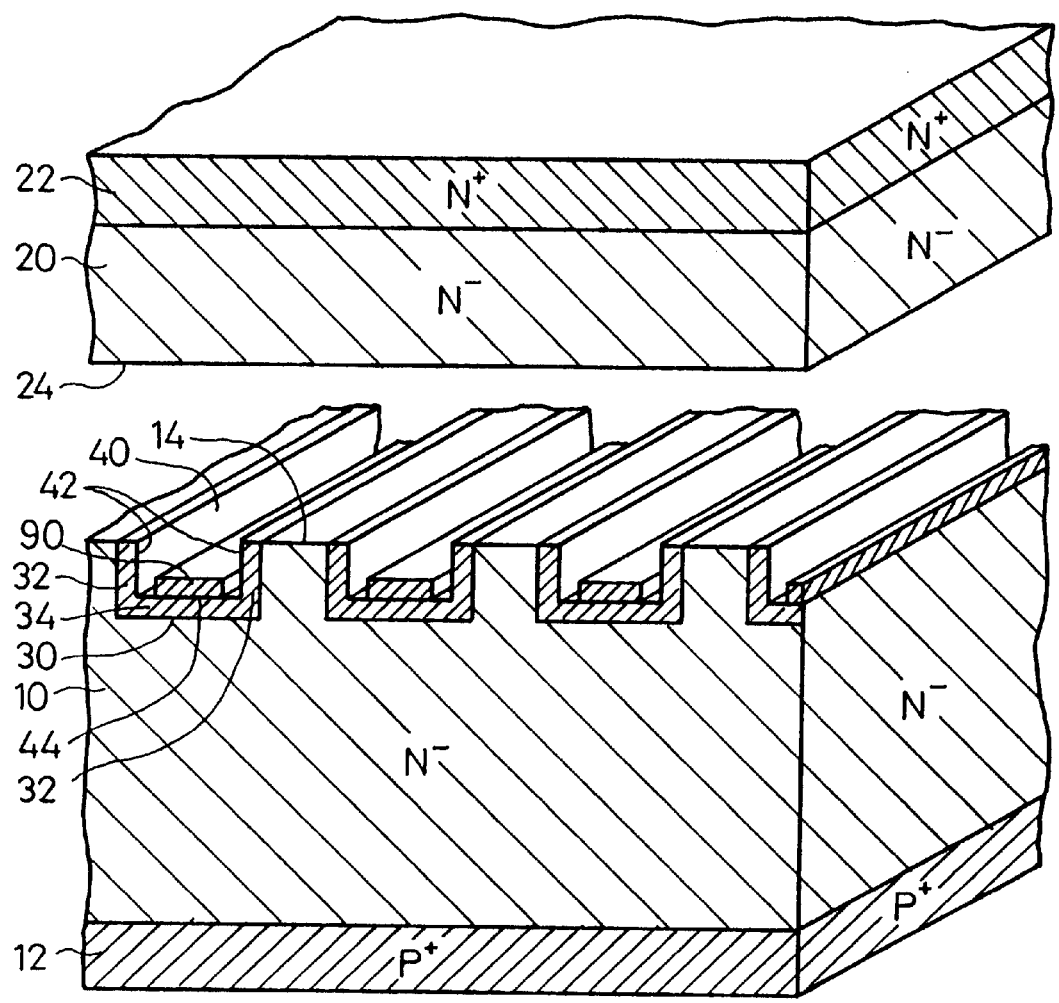
FIG. 14 is a fragmentary sectional perspective view of a static induction thyristor according to a sixth embodiment of the present invention, the view being also illustrative of a method of fabricating the static induction thyristor according to the sixth embodiment.
Figure 15:
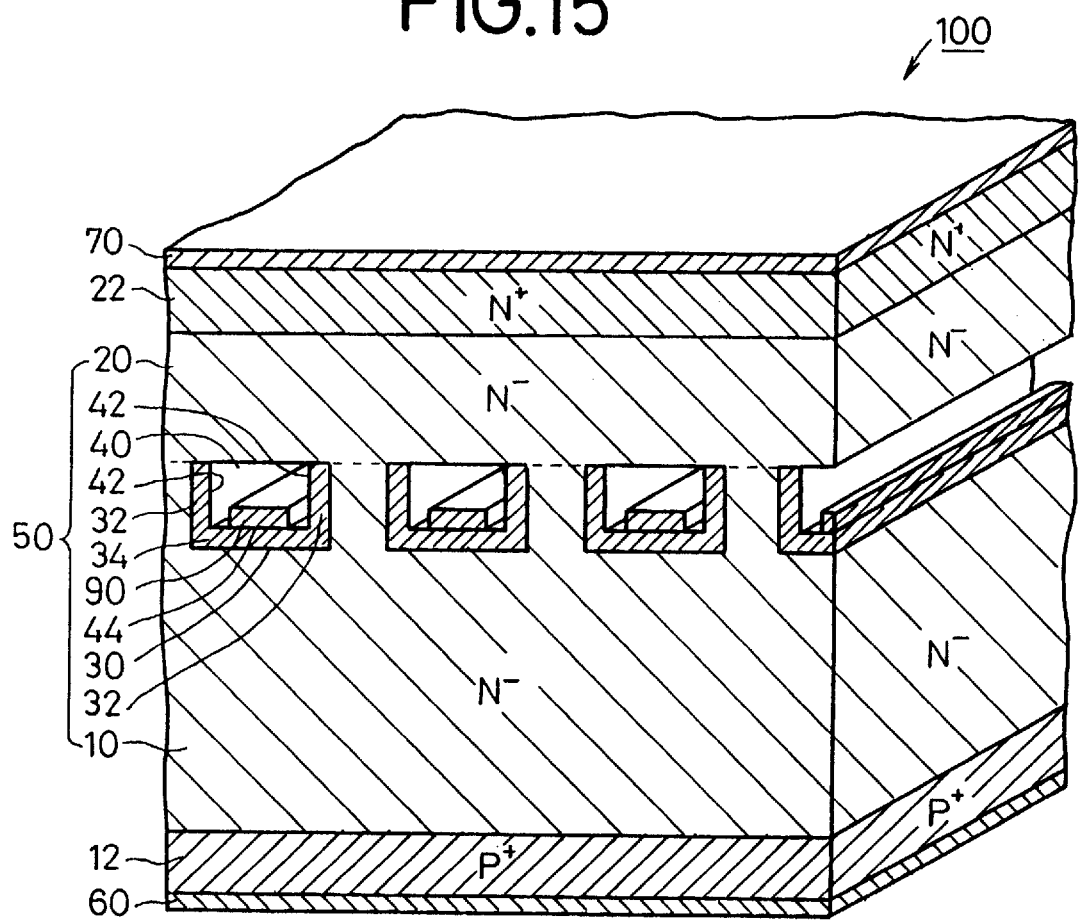
FIG. 15 is a fragmentary sectional perspective view of the static induction thyristor according to the sixth embodiment, the view being also illustrative of the method of fabricating the static induction thyristor according to the sixth embodiment.

FIGS. 14 and 15 show in fragmentary sectional perspective a static induction thyristor 100 according to a sixth embodiment of the present invention, the view being also illustrative of a method of fabricating the static induction thyristor according to the sixth embodiment.

First, as shown in FIG. 14, N⁻ substrates 10, 20 having respective mirror-finished surfaces to be joined to each other are prepared.

Then, a P⁺ layer 12 is formed on the lower surface of the N⁻ substrate 10 by diffusing an impurity therein. Recesses 40 each having a width of 40 $\mu$m and a depth of 25 $\mu$m for accommodating gate electrodes 90 therein are formed at a pitch or interval of 60 $\mu$m in the upper mirror-finished surface of the N⁻ substrate 10 by photolithography.

Thereafter, a P-type impurity of boron is selectively diffused to form P⁺ gate regions 30 selectively in regions of the N⁻ substrate 10 which are exposed at the side walls 42 and bottoms 44 of the recesses 40. The P⁺ gate regions 30 thus formed are composed of side gate regions 32 and bottom gate regions 34. The boron is diffused at a temperature ranging from 1050 to 1200° C. in an atmosphere of $BBr_3+O_2$. When the boron is diffused, oxide films are formed on the side walls 42 and bottoms 44 of the recesses 40, but are omitted from illustration.

Then, gate electrodes 90 of tungsten each having a width of 20 $\mu$m and a film thickness of 0.5 $\mu$m are formed selectively on the bottom gate regions 34 in the respective recesses 40 by photolithography.

Then, an N⁺ layer 22 is formed on the upper surface of the N⁻ substrate 20 by diffusing an impurity therein.

Then, the N⁻ substrates 10, 20 are ultrasonically cleaned in an aqueous solution of sulfuric acid and hydrogen peroxide to remove organic materials and metals therefrom.

The N⁻ substrates 10, 20 are thereafter cleaned by pure water, and then dried by a spinner at a room temperature.

Then, as shown in FIG. 15, while lands 14 between the recesses 40 in the upper surface of the N⁻ substrate 10 are being held against a lower mirror-finished surface 24 of the N⁻ substrate 20, the N⁻ substrates 10, 20 are joined to each other by heating them at 800° C. in a hydrogen atmosphere. If the gate electrodes 90 are made of aluminum, then the N⁻ substrates 10, 20 are joined to each other at 400° C.

Thereafter, an anode electrode 60 and a cathode electrode 70 are formed respectively on the lower surface of the P⁺ layer 12 which is formed on the lower surface of the N⁻ substrate 10 and the upper surface of the N⁺ layer 22 which is formed on the upper surface of the N⁻ substrate 20.

In the static induction thyristor 100 thus fabricated, the P⁺ layer 12 functions as an anode, the N⁺ layer 22 as a cathode, the N⁻ substrates 10, 20 as an N base 50, and the P⁺ gate regions 30 and the gate electrodes 90 as a gate for controlling an anode current flowing between the anode electrode 60 and the cathode electrode 70.

Since the gate electrodes 90 of tungsten are disposed on the bottom gate regions 34, the lateral resistance of the gate is reduced, increasing a maximum cutoff current, and a carrier withdrawal current is increased for higher-speed switching.

The gate electrodes 90 are accommodated in the recesses 40 in the N⁻ substrate 10 before the N⁻ substrates 10, 20 are joined to each other. Consequently, it is not necessary to form grooves of a large aspect ratio in the N⁺ layer 22 and the N⁻ substrate 20 and then form the gate electrodes 90 in such grooves, and the N⁺ layer 22 and the N⁻ substrate 20 would not be divided by such grooves into small strips which would impose a high resistance.

The formation of the recesses 40 in the upper surface of the N⁻ substrate 10 even with a dry etching process at a low etching rate is not time-consuming because the recesses 40 only need to be capable of holding the gate electrodes 90 therein.

As the gate electrodes 90 are accommodated in the recesses 40 defined in the upper surface of the N⁻ substrate 10, no recesses are required to be formed in the lower surface 24 of the N⁻ substrate 20 which is to be joined by the lands 14 on the upper surface of the N⁻ substrate 10, and hence the lower surface 24 may remain flatwise. Since no special alignment is necessary to join the lands 14 on the upper surface of the N⁻ substrate 10 to the lower surface 24 of the N⁻ substrate 20, it is easy to fabricate the static induction thyristor 100.

Figure 16:
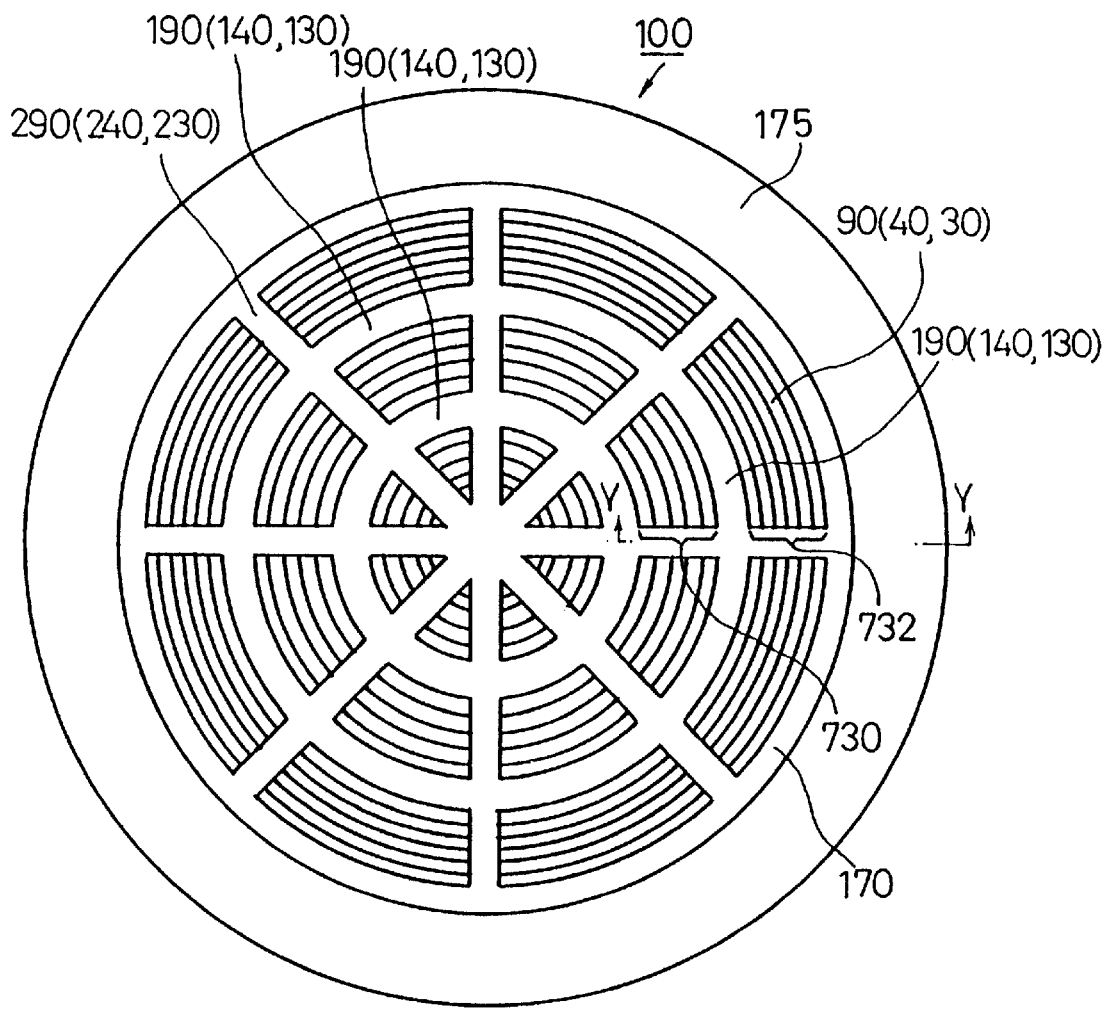
FIG. 16 is a plan view of the static induction thyristor according to the sixth embodiment, the view being also illustrative of the method of fabricating the static induction thyristor according to the sixth embodiment.
Figure 17:
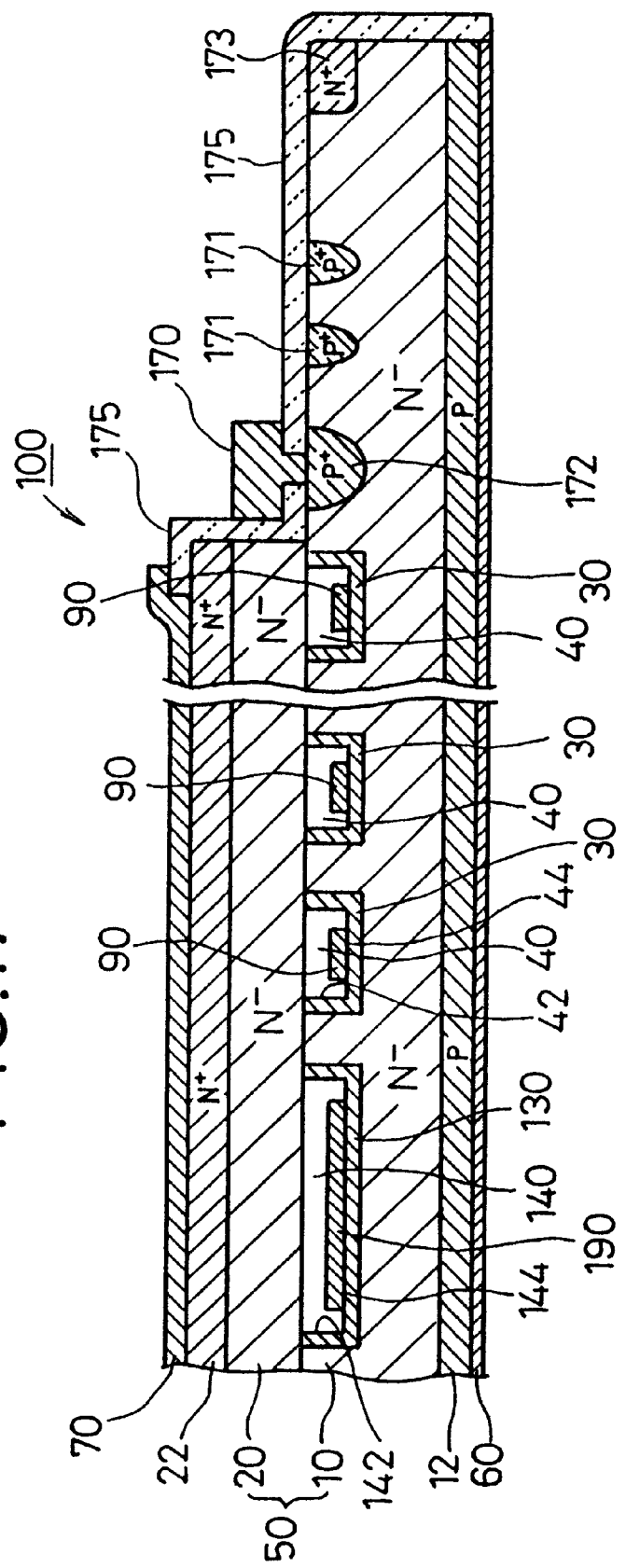
FIG. 17 is a cross-sectional view taken along line Y—Y of FIG. 16.

FIG. 16 shows in plan the static induction thyristor 100 according to the sixth embodiment with the cathode electrode 70, the N⁺ layer 22, and the N⁻ substrate 20 omitted from illustration. FIG. 17 shows the static induction thyristor 100 fragmentarily in cross section taken along line Y—Y of FIG. 16.

Two guard rings 171 are disposed in an outer circumferential region of the N⁻ substrate 10 to reduce an electric field concentration, and an N⁺ channel stopper 173 is disposed in an outermost circumferential region of the N⁻ substrate 10 to prevent a depletion layer from spreading to the outer end of the N⁻ substrate 10. The outer guard ring 171 and the channel stopper 173 are spaced from each other by a distance that is equal to or greater than the thickness of the N⁻ substrate 10.

The N⁻ substrate 10 has an outer circumferential surface covered with an insulating layer 175 of SiO₂. The insulating layer 175 is also disposed on side walls of the N⁻ substrate 20 and the N⁺ layer 22, and extends to a circumferential region of the upper surface of the N⁺ layer 22. The cathode electrode 70 is disposed on the N⁺ layer 22 and has a circumferential region extending over the insulating layer 175 on the circumferential region of the upper surface of the N⁺ layer 22.

An annular gate electrode lead-out layer 170 is disposed on the upper surface of the N⁻ substrate 10 radially inwardly of the guard rings 171, and an annular P⁺ layer 172 is disposed in the upper surface of the N⁻ substrate 10 underneath the annular gate electrode lead-out layer 170 in electrical connection thereto. The annular P⁺ layer 172 has a depth which is the same as the depth of the guard rings 171. The annular gate electrode lead-out layer 170 is connected to an external lead (not shown). The annular gate electrode lead-out layer 170 is formed as follows: After the N⁻ substrate 10 and the N⁻ substrate 20 are joined to each other, a circumferential region of the N⁻ substrate 20 is etched away, exposing the surface of a circumferential region of the N⁻ substrate 10, and then the insulating layer 175 is deposited. Thereafter, the annular gate electrode lead-out layer 170 is deposited on the insulating layer 175.

Wide recesses 140 each having a width of 100 μm, wide gate regions 130 that are disposed in those regions of the N⁻ substrate 10 which are exposed at side walls 142 and bottoms 144 of the recesses 140, and wide gate electrodes 190 of tungsten which are disposed on the wide gate regions 130 are formed concentrically in the upper surface of the N⁻ substrate 10 which is disposed radially inwardly of the annular gate electrode lead-out layer 170. While only two recesses 140, two wide gate regions 130, and two wide gate electrodes 90 are shown in FIG. 16, 20 30 of these recesses 140, wide gate regions 130, and wide gate electrodes 90 are actually formed in the N⁻ substrate 10.

Narrow recesses 40 each having a width of 30 μm are concentrically formed in the upper surface of the N⁻ substrate 10 at a region 730 between the wide recesses 140 and at a region 732 between the outermost wide recess 140 and the annular gate electrode lead-out layer 170. While only several recesses 40 are shown in FIG. 16, 50~100 of these recesses 40 are actually formed in the N⁻ substrate 10 at the regions 730, 732. The P⁺ gate regions 90 are concentrically formed in those regions of the N⁻ substrate 10 which are exposed at the side walls 42 and bottoms 44 of the narrow recesses 40.

The gate regions 30, the gate regions 130, the gate electrodes 90, the gate electrodes 190, and the annular gate electrode lead-out layer 170 which are disposed concentrically are interconnected by radial wide gate regions 230 and radial wide gate electrodes 290. The wide gate regions 230 are formed by defining radial wide recesses 240 in the upper surface of the N⁻ substrate 10 and forming P⁺ regions in those regions of the N⁻ substrate 10 which are exposed at the side walls and bottoms of the wide recesses 240. The wide gate electrodes 290 are formed on the wide gate regions 230. The wide gate regions 130 and the gate electrodes 190 which are concentric with each other, and the gate regions 230 and gate electrodes 290 which extend radially are effective in interconnecting the narrow gate regions 30, the gate electrodes 90, and the annular gate electrode lead-out layer 170 with a low resistance.

The wide gate regions 130, the wide gate regions 230, the wide gate electrodes 190, the wide gate electrodes 290, the wide recesses 140, the wide recesses 240, the annular gate electrode lead-out layer 170, the P⁺ layer 172 underneath the annular gate electrode lead-out layer 170, the guard rings 171, the channel stopper 173, the insulating layer 175, and the cathode electrode 70 are not limited to the specific structural details in this embodiment, but may be incorporated in semiconductor devices according to other embodiments described later on.

7th Embodiment

Figure 18:
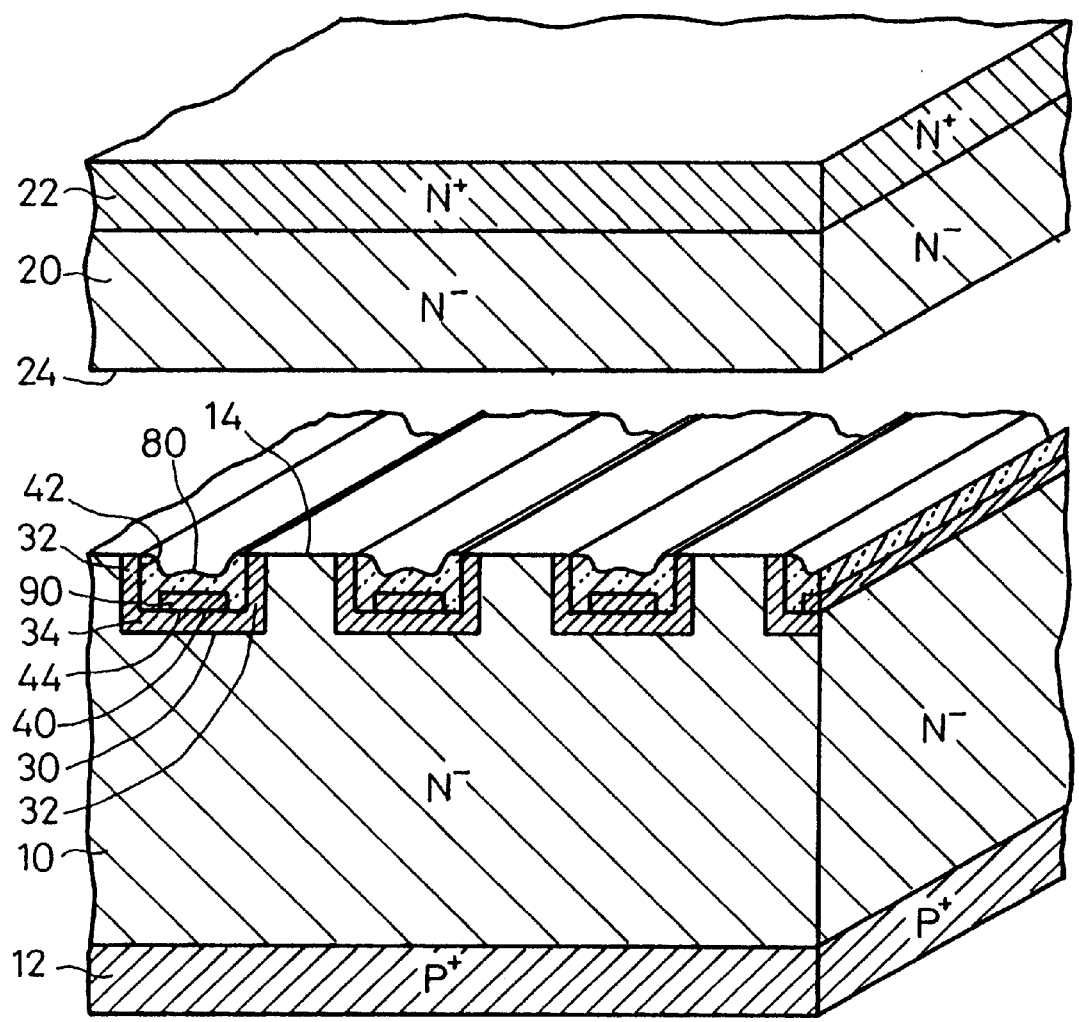
FIG. 18 is a fragmentary sectional perspective view of a static induction thyristor according to a seventh embodiment of the present invention, the view being also illustrative of a method of fabricating the static induction thyristor according to the seventh embodiment.
Figure 19:
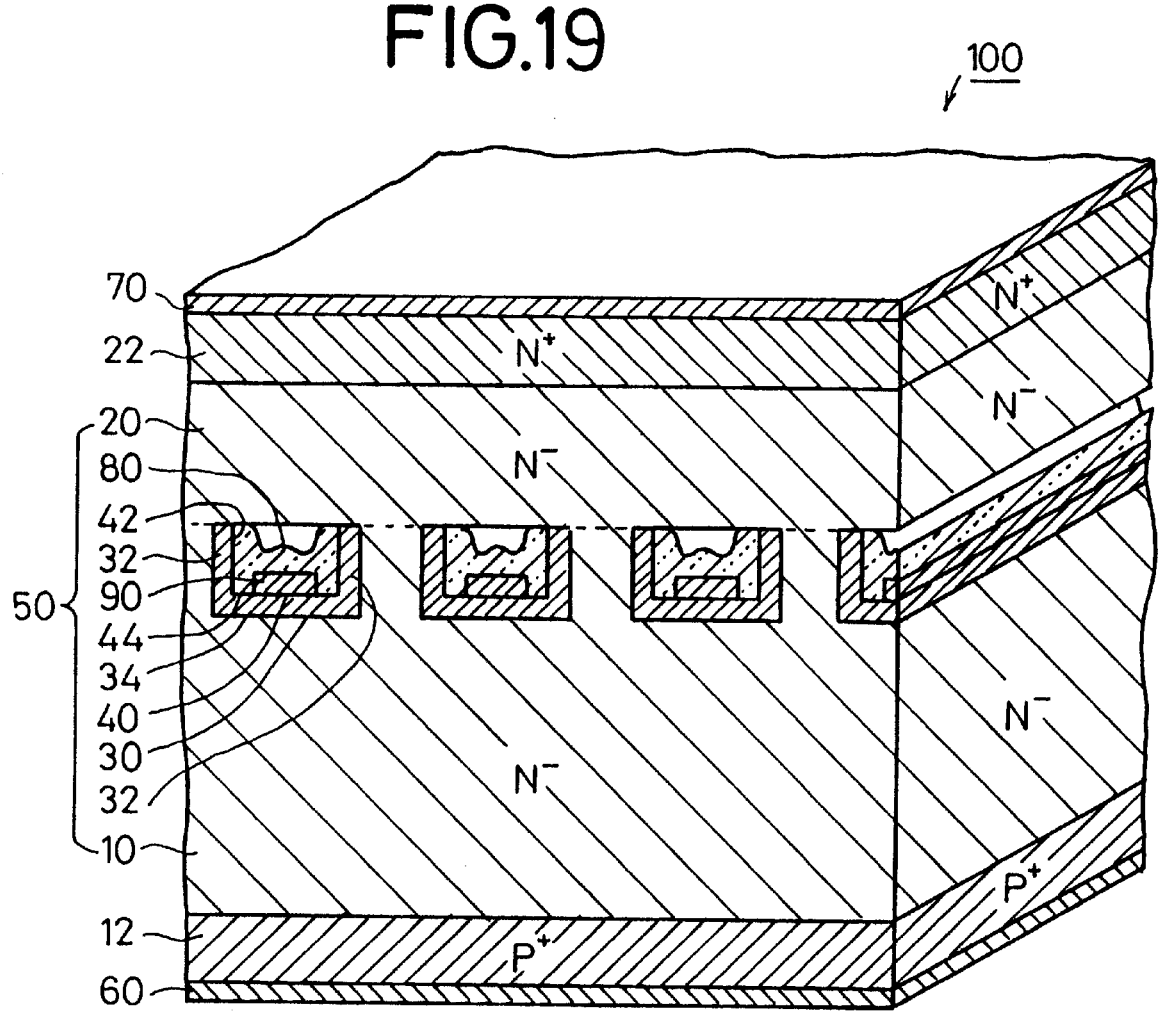
FIG. 19 is a fragmentary sectional perspective view of the static induction thyristor according to the seventh embodiment, the view being also illustrative of the method of fabricating the static induction thyristor according to the seventh embodiment.

FIGS. 18 and 19 show in fragmentary sectional perspective a static induction thyristor 100 according to a seventh embodiment of the present invention, the views being also illustrative of a method of fabricating the static induction thyristor according to the seventh embodiment.

The static induction thyristor 100 according to the seventh embodiment differs from the static induction thyristor 100 according to the sixth embodiment in that, after the gate regions 30 and the gate electrodes 90 are formed, oxide films 80 are formed in the respective recesses 40 in covering relation to the gate electrodes 90 and the gate regions 30, and thereafter, the lands 14 of the N$^-$ substrate 10 between the recesses 40 and the lower surface 24 of the N$^-$ substrate 20 are joined to each other. The other details of the static induction thyristor 100 and the method of fabricating the static induction thyristor 100 according to the seventh embodiment are the same as those of the static induction thyristor 100 according to the sixth embodiment. According to the seventh embodiment, as described above, the oxide films 80 are formed in the respective recesses 40 in covering relation to the gate electrodes 90 and the gate regions 30, and thereafter, the lands 14 of the N$^-$ substrate 10 between the recesses 40 and the lower surface 24 of the N$^-$ substrate 20 are joined to each other. Therefore, when the lands 14 of the N$^-$ substrate 10 between the recesses 40 and the lower surface 24 of the N$^-$ substrate 20 are joined to each other, the lands 14 and the lower surface 24 are kept clean and can be joined well to each other.

If the gate electrodes 90 are made of a metal having a high melting point such as tungsten or the like or a metal such as aluminum or the like, then the oxide film 80 should preferably be deposited by chemical vapor deposition (CVD). If the gate electrodes 90 are made of polycrystalline silicon doped with an impurity, then the oxide film 80 may be formed by oxidizing the polycrystalline silicon, or may be deposited by CVD.

According to the seventh embodiment, an oxide film is formed by thermal oxidization or CVD, and thereafter the upper surface of the N$^-$ substrate 10 is ground to define the oxide films 80.

The oxide film 80 may be replaced with an insulating film such as a silicon nitride film, a silicon oxide nitride film, or the like.

8th Embodiment

Figure 20:
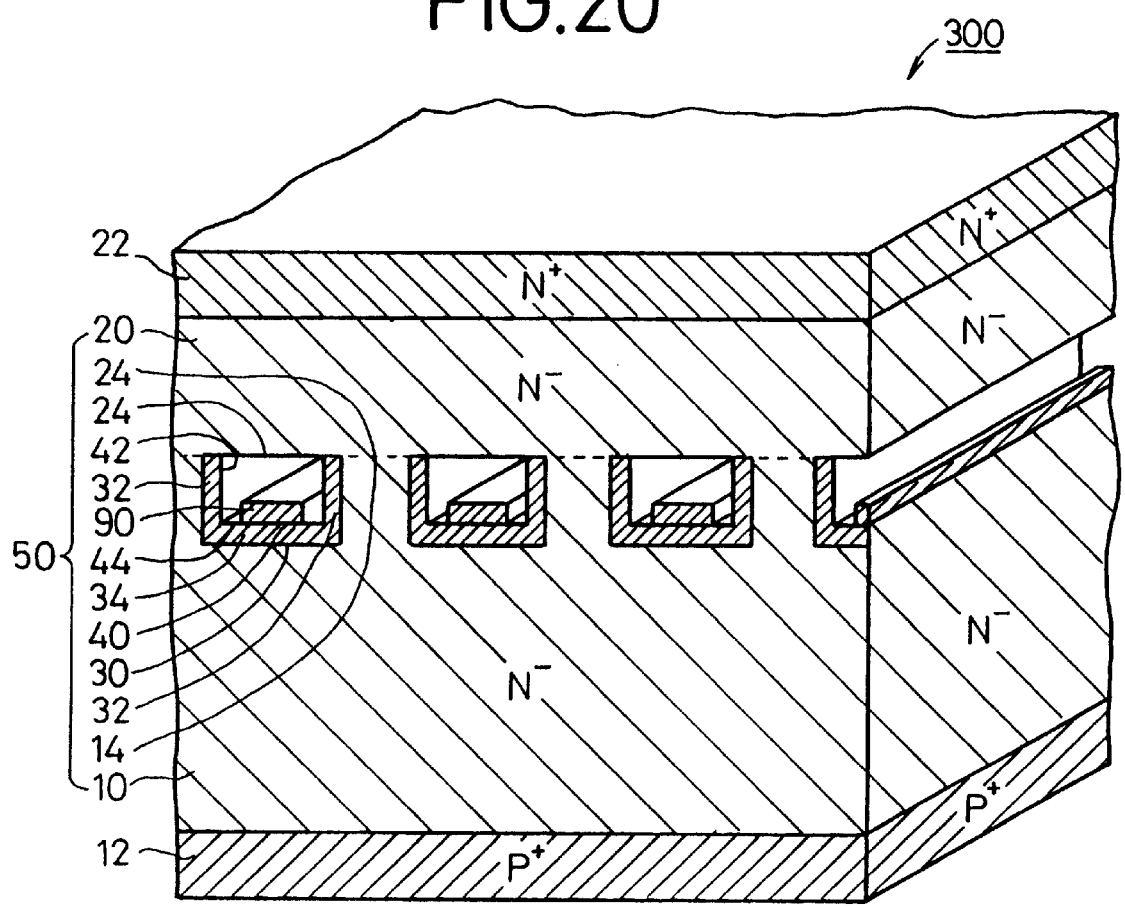
FIG. 20 is a fragmentary sectional perspective view of a static induction thyristor according to an eighth embodiment of the present invention, the view being also illustrative of a method of fabricating the static induction thyristor according to the eighth embodiment.
Figure 21:
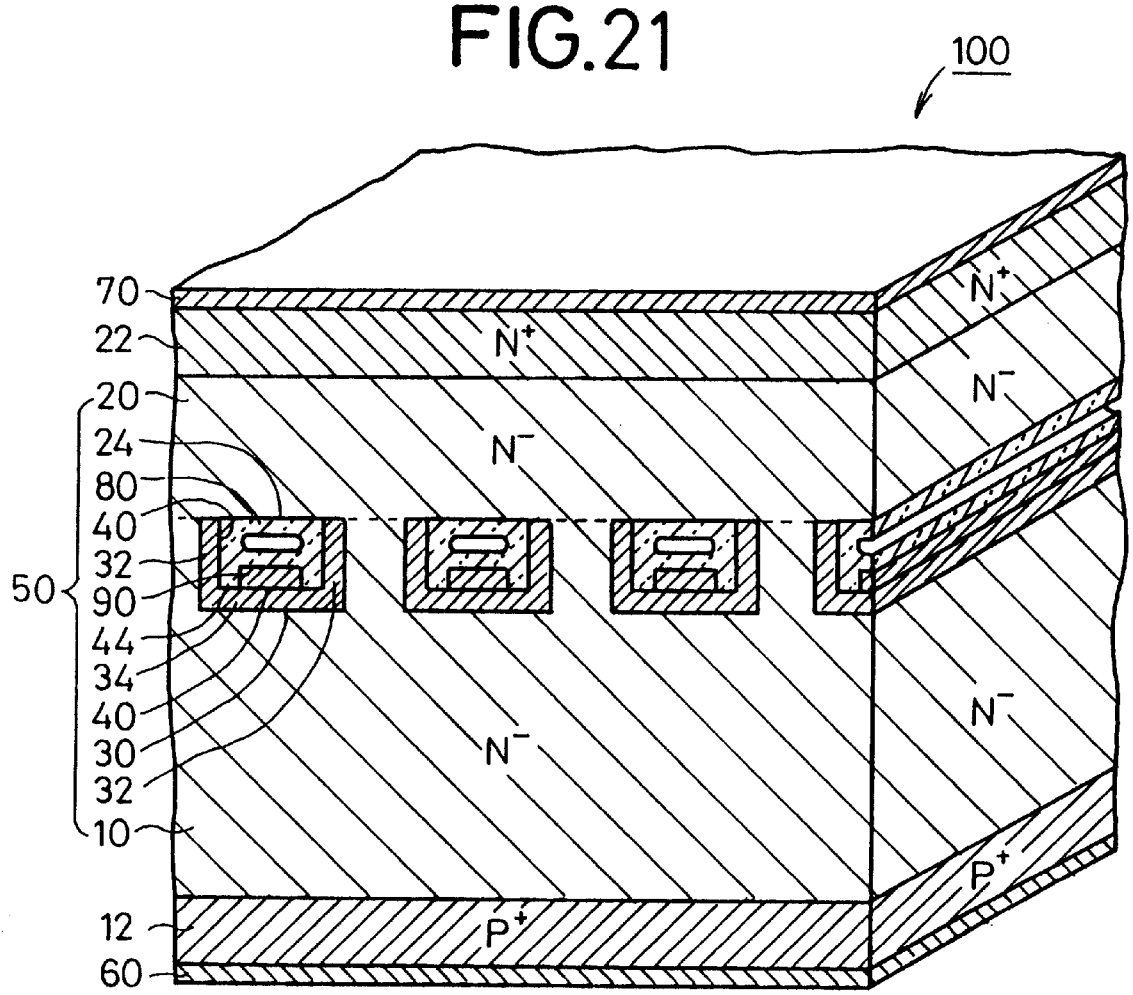
FIG. 21 is a fragmentary sectional perspective view of the static induction thyristor according to the eighth embodiment, the view being also illustrative of the method of fabricating the static induction thyristor according to the eighth embodiment.

FIGS. 20 and 21 show in fragmentary sectional perspective a static induction thyristor 100 according to an eighth embodiment of the present invention, the views being also illustrative of a method of fabricating the static induction thyristor according to the eighth embodiment.

The static induction thyristor 100 according to the eighth embodiment differs from the static induction thyristor 100 according to the sixth embodiment in that the gate electrodes 90 are made of polycrystalline silicon doped with boron, and after the N$^-$ substrates 10, 20 are joined to each other, thereby providing a joined semiconductor substrate assembly 300 composed of an N base 50, the joined semiconductor substrate assembly 300 is thermally oxidized to cover the gate electrodes 90, the side gate regions 32, the bottom gate regions 34, and the lower surface 24 of the N$^-$ substrate 20 with the oxide film 80, after which the anode electrode 60 and the cathode electrode 70 are formed. The other details of the static induction thyristor 100 and the method of fabricating the static induction thyristor 100 according to the eighth embodiment are the same as those of the static induction thyristor 100 according to the sixth embodiment.

According to the eighth embodiment, the dielectric strength between the gate and the cathode is also increased because the pn junction is passivated by the oxide film 80.

In the above embodiments, the present invention is applied to a static induction thyristor. However, the principles of the present invention are also applicable to a static induction transistor where the P$^+$ layer 12 in each of the static induction thyristors according to the first through eighth embodiments described above with reference to FIGS. 1 through 21 is replaced with an N$^+$ drain.

9th Embodiment

Figure 22:
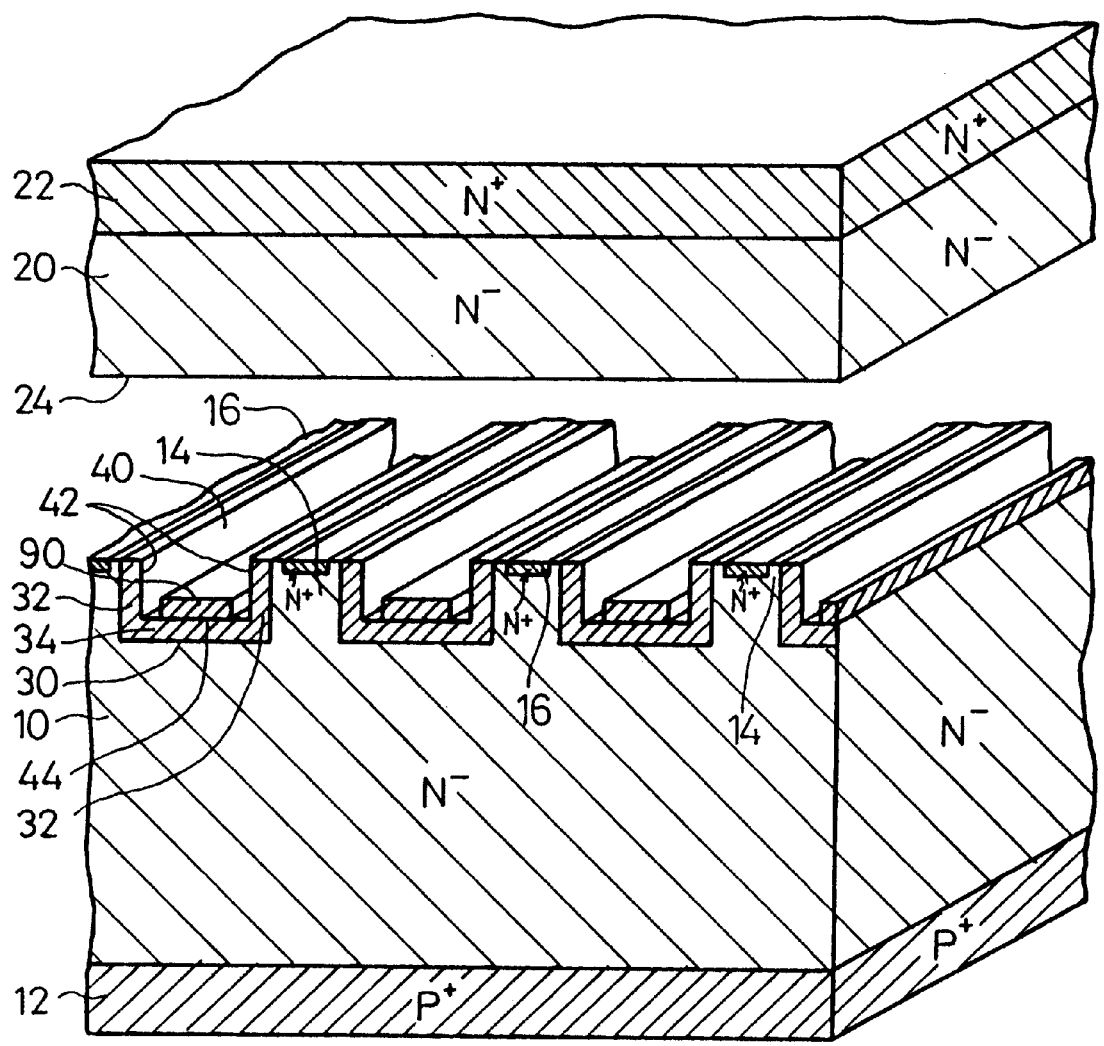
FIG. 22 is a fragmentary sectional perspective view of a static induction thyristor according to a ninth embodiment of the present invention, the view being also illustrative of a method of fabricating the static induction thyristor according to the ninth embodiment.
Figure 23:
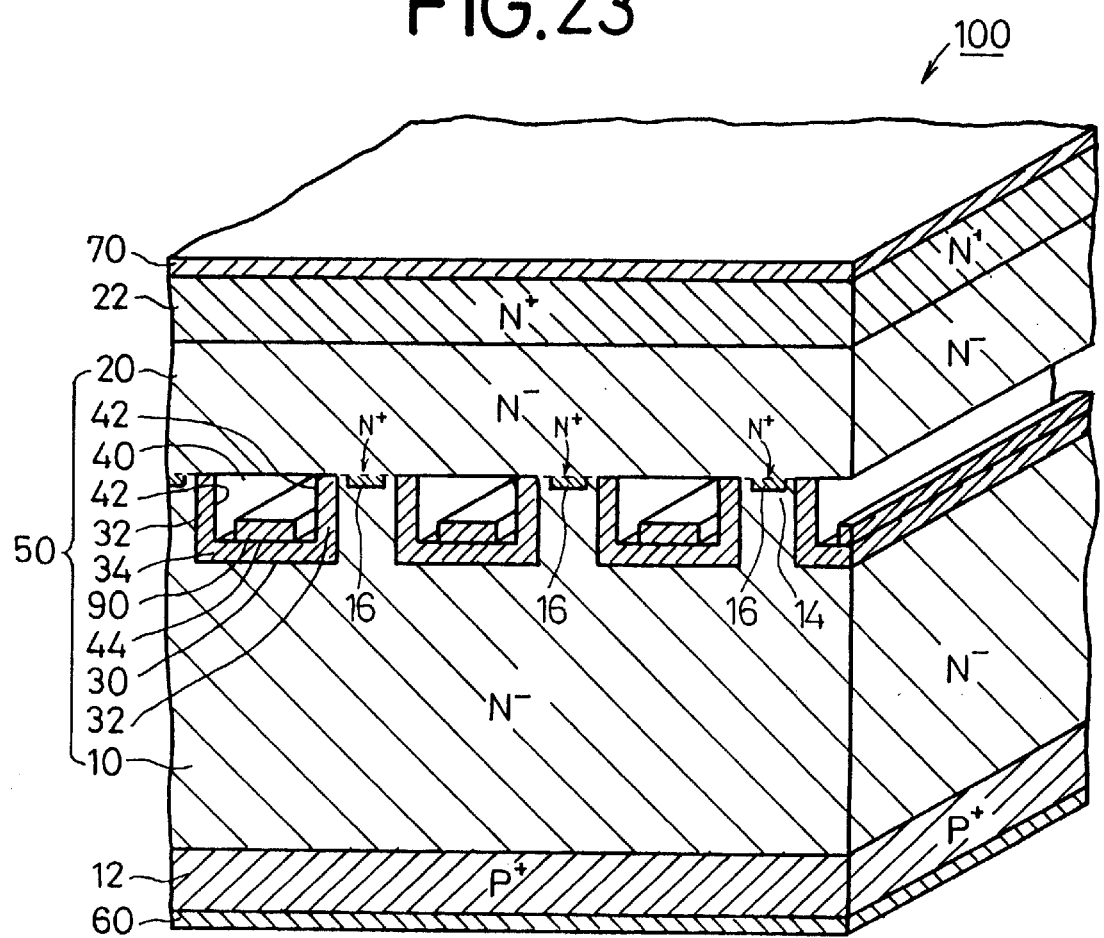
FIG. 23 is a fragmentary sectional perspective view of the static induction thyristor according to the ninth embodiment of the present invention, the view being also illustrative of the method of fabricating the static induction thyristor according to the ninth embodiment.

FIGS. 22 and 23 are fragmentary sectional perspective views of a static induction thyristor according to a ninth embodiment of the present invention, the views being also illustrative of a method of fabricating the static induction thyristor according to the ninth embodiment. This Embodiment is similar to the 6th embodiment described above, but it is different in that high impurity concentration regions are formed at a portion corresponding to a joining surface between lands 14 of an N$^-$ substrate 10 and an N$^-$ substrate 20.

Now N$^-$ substrates 10, 20 having respective mirror-finished surfaces to be joined to each other are prepared.

Next, as shown in FIG. 22, a P$^+$ layer 12 is formed on the lower surface of the N$^-$ substrate 10 by diffusing an impurity therein. Subsequently, N$^+$ layers 16 are selectively formed in the upper surface of the N$^-$ substrate 10 by photolithography to have a predetermined width and have a depth of about 50 Å–500 Å, preferably 100 Å. The impurity concentration in this embodiment is at least about $10^{19-20}$ cm$^{-3}$. Next, recess 40 each having a width of 40 $\mu$m and a depth of 25 $\mu$m for accommodating gate electrodes 90 therein are formed in the N$^-$ substrate 10 at a pitch or interval of 60 $\mu$m between the N$^+$ layers 16.

Thereafter, a P-type impurity of boron is selectively diffused to form P$^+$ gate regions 30 selectively in regions of the N$^-$ substrate 10 which are exposed at the side walls 42 and bottoms 44 of the recesses 40. The P$^+$ gate regions 30 thus formed are composed of side gate regions 32 and bottom gate regions 34.

Then, gate electrodes 90 of tungsten each having a width of 20 $\mu$m and a film thickness of 0.5 $\mu$m are formed selectively on the bottom gate regions 34 in the respective recesses 40 by photolithography.

On the other hand, an N$^+$ layer 22 is formed on the upper surface of the N$^-$ substrate 20 by diffusing an impurity therein.

Then, the N$^-$ substrates 10, 20 are ultrasonically cleaned in an aqueous solution of sulfuric acid and hydrogen peroxide to remove organic materials and metals therefrom.

The N$^-$ substrates 10, 20 are thereafter cleaned by pure water, and then dried by a spinner at a room temperature.

Then, as shown in FIG. 23, while lands 14 between the recesses 40 in the upper surface of the N$^-$ substrate 10 are being held to contact with a lower surface 24 of the N$^-$ substrate 20, the N$^-$ substrates 10, 20 are joined to each other by heating them at 800° C. in a hydrogen atmosphere. If the gate electrodes 90 are made of aluminum, then the N$^-$ substrates 10, 20 are joined to each other at 400° C.

Thereafter, an anode electrode 60 and a cathode electrode 70 are formed respectively on the lower surface of the P$^+$ layer 12 which is formed on the lower surface of the N$^-$ substrate 10 and the upper surface of the N$^+$ layer 22 which is formed on the upper surface of the N$^-$ substrate 20.

In the static induction thyristor 100 thus fabricated, the P⁺ layer 12 functions as an anode, the N⁺ layer 22 as a cathode, the N⁻ substrates 10, 20 as an N base 50, and the P⁺ gate regions 30 and the gate electrodes 90 as a gate for controlling an anode current flowing between the anode electrode 60 and the cathode electrode 70.

10th Embodiment

Figure 24:
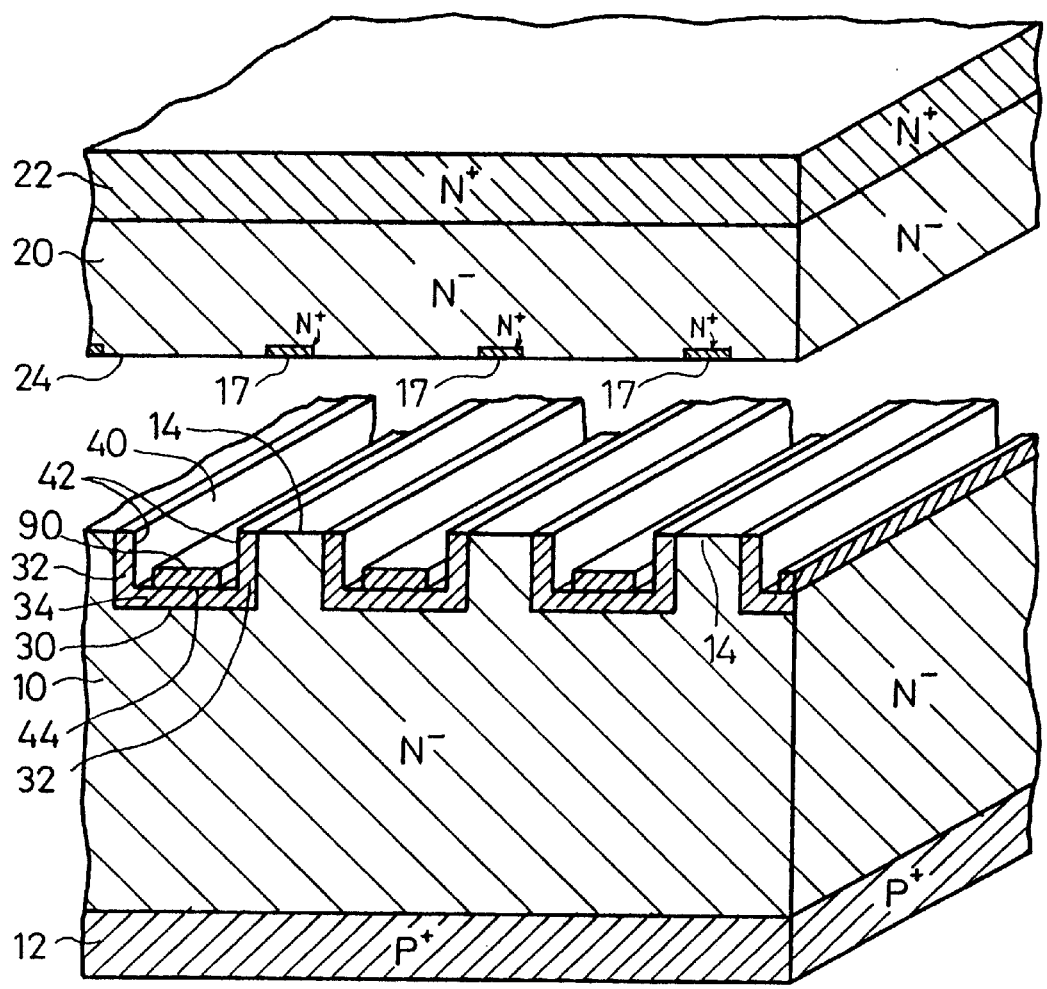
FIG. 24 is a fragmentary sectional perspective view of a static induction thyristor according to a tenth embodiment of the present invention, the view being also illustrative of a method of fabricating the static induction thyristor according to the tenth embodiment.

FIG. 24 is a fragmentary sectional perspective view of a static induction thyristor according to a tenth embodiment of the present invention, the view being also illustrative of a method of fabricating the static induction thyristor according to the tenth embodiment.

In the 9th Embodiment, the high impurity concentration regions, that are the N⁺ layers 16, are selectively formed on the side of the N⁻ substrate 10. However, in the 10th embodiment, high impurity concentration regions are formed otherwise on a side of an N⁻ substrate 20 facing an N⁻ substrate 10.

Namely, with respect to the N⁻ substrate 10, the N⁻ substrates 10, 20 having respective mirror-finished surfaces are prepared, and then in the same manner as the 6th Embodiment, processing steps are executed until gate electrodes 90 of tungsten each having a width of 20 $\mu$m and a film thickness of 0.5 $\mu$m are formed selectively on the bottom regions 34 in the respective recesses 40. (see FIG. 14).

On the other hand, an N⁺ layer 22 is formed on the upper surface of the N⁻ substrate 20 by diffusing an impurity therein. Then N⁺ layers 17 as high impurity concentration regions separated by an interval of 60 $\mu$m are formed selectively at portions facing the N⁻ substrate 10 to have a width of 15 $\mu$m, a depth of 50–500 Å, and preferably a thickness of 100 Å. The impurity concentration for forming the N⁺ layers 17 is at least $10^{19-20}$ cm⁻³ in this embodiment.

Figure 25:
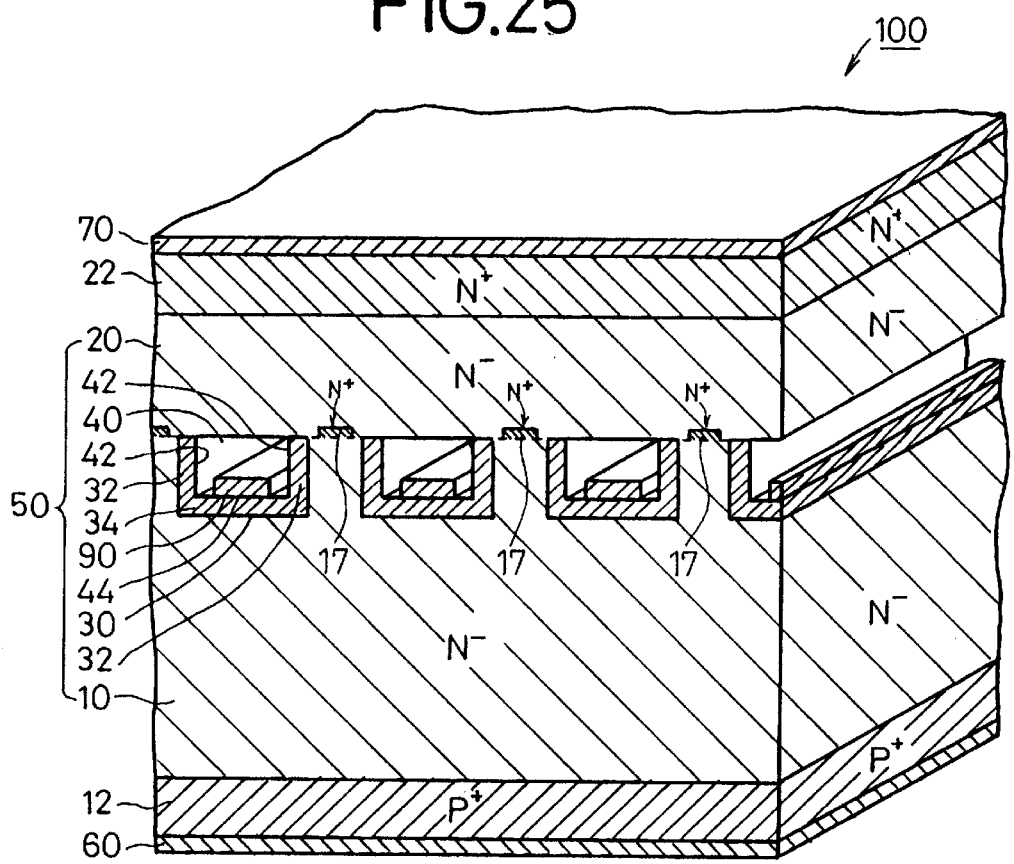
FIG. 25 is a fragmentary sectional perspective view of the static induction thyristor according to the tenth embodiment of the present invention, the view being also illustrative of the method of fabricating the static induction thyristor according to the tenth embodiment.
Figure 26:
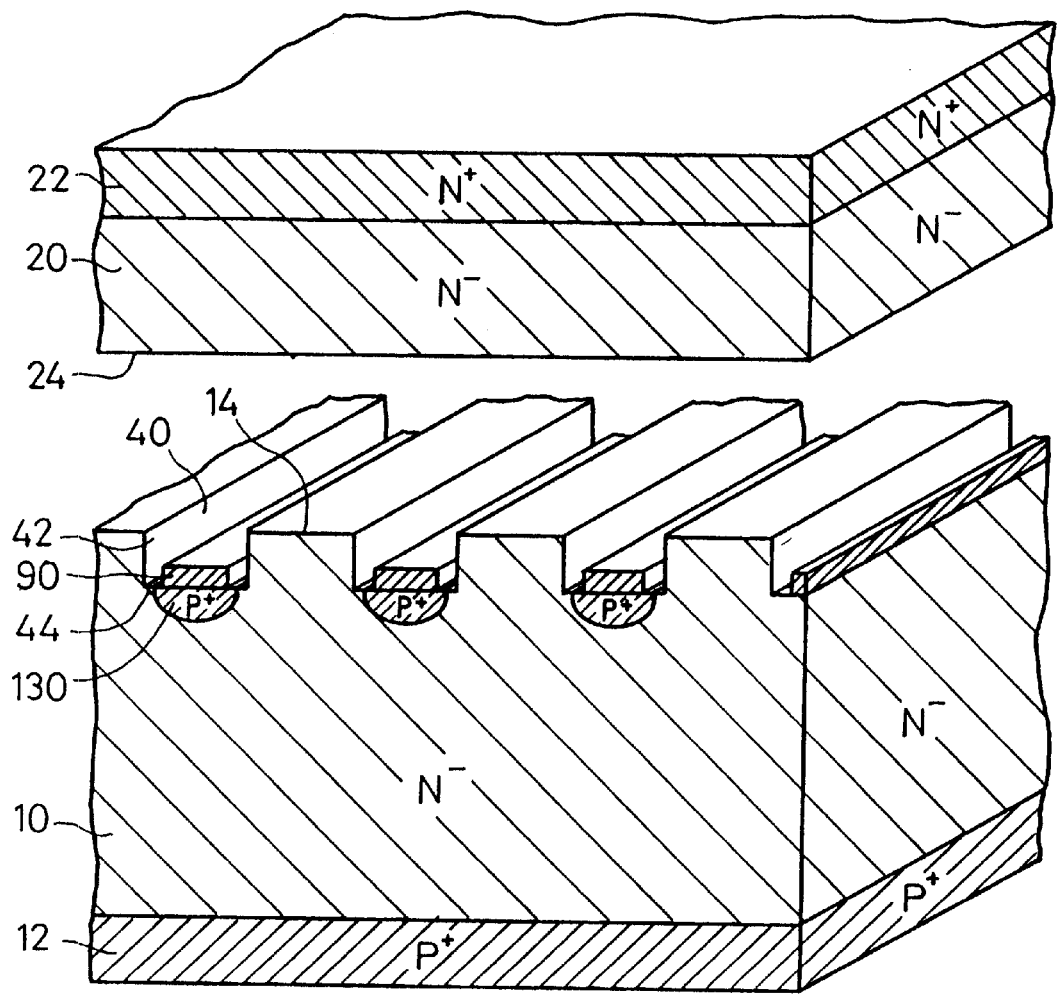
FIG. 26 is a fragmentary sectional perspective view of a conventional joined type static induction thyristor, the view being also illustrative of a method of fabricating the conventional joined type static induction thyristor.
Figure 27:
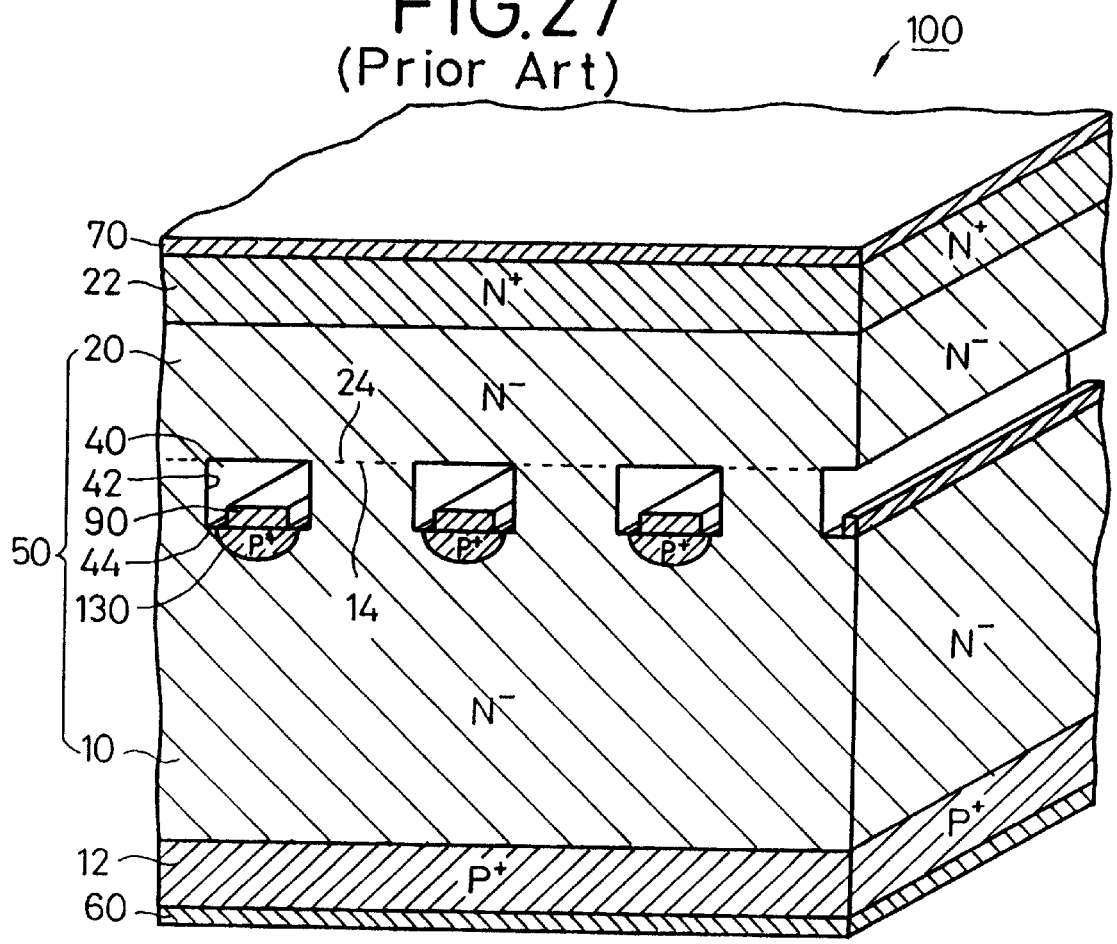
FIG. 27 is a fragmentary sectional perspective view of the conventional joined type static induction thyristor, the view being also illustrative of the method of fabricating the conventional joined type static induction thyristor.

Then, the N⁻ substrates 10, 20 are ultrasonically cleaned in an aqueous solution of sulfuric acid and hydrogen peroxide to remove organic materials and metals therefrom, followed by executing the same steps as those in the 6th embodiment (see FIG. 25).

The aforementioned 9th and 10th embodiments provide significant effects as follows.

In general, when substrates having low impurity concentrations are joined to each other, a joined portion therebetween has a relatively high electric resistance. Therefore, an inconvenience arises in that the power consumption and the amount of heat generation increase. It is in the embodiments described above that the high impurity concentration regions are formed in at least one surface of the two semiconductor substrates to be joined to each other in order to dissolve the inconvenience. Namely, the semiconductor substrates in which the high impurity concentration regions (N⁺ layers 16 or 17) are formed in at least one surface are joined to each other followed by heating so that the impurity diffuses to the other substrate. Thus an electrically excellent ohmic junction is obtained.

In such an arrangement, there is a fear that the high impurity concentration regions (N⁺ layers 16 or 17) existing at the junction between the semiconductor substrates may undergo decrease in gate voltage resistance for contacting with the gate layer, and the major current cannot be sufficiently controlled. However, in the embodiments described above, such a fear is avoided because the high concentration regions at the junction are formed at positions separated from the gate region by about several $\mu$m.

Although certain preferred embodiments of the present invention has been shown and described in detail, it should be understood that various changes and modifications may be made therein without departing from the scope of the appended claims.

What is claimed is:

1. A method of fabricating a semiconductor device, comprising the steps of:

preparing a first semiconductor substrate and a second semiconductor substrate, both of one conductivity type;

defining recesses in a surface of said first semiconductor substrate;

selectively forming gate regions of other conductivity type which are doped with an impurity, in regions of said first semiconductor substrate which are exposed at least at side walls of the recesses, with said surface of the first semiconductor substrate being exposed between said gate regions; and joining said surface of the first semiconductor substrate which is exposed between said gate regions to a surface of said second semiconductor substrate.

2. A method according to claim 1, wherein said side walls of the recesses extend substantially perpendicularly to said surface of the first semiconductor substrate.

3. A method according to claim 1, wherein said step of selectively forming gate regions of other conductivity type comprises the step of:

selectively forming gate regions of other conductivity type which are doped with an impurity, in regions of said first semiconductor substrate which are exposed at side walls and bottoms of the recesses, with said surface of the first semiconductor substrate being exposed between said gate regions.

4. A method according to claim 1, wherein after said gate regions are formed, insulating films are formed in said recesses in covering relation to said gate regions, and thereafter said surface of the first semiconductor substrate which is exposed between said gate regions is joined to said surface of said second semiconductor substrate.

5. A method according to claim 1, further comprising the step of:

before said surface of the first semiconductor substrate which is exposed between said gate regions is joined to said surface of said second semiconductor substrate, forming gate electrodes disposed in said recesses, said gate electrodes being made of a good electric conductor electrically connected to said gate regions.

6. A method according to claim 5, further comprising the step of:

before said surface of the first semiconductor substrate which is exposed between said gate regions is joined to said surface of said second semiconductor substrate, forming insulating films in said recesses in covering relation to said gate electrodes.

7. A method according to claim 1, further comprising the steps of:

forming a first semiconductor layer of said other conductivity type on either one of another surface of said first semiconductor substrate which lies opposite to said surface thereof and another surface of said first semiconductor substrate which lies opposite to said surface thereof;

forming one of an anode electrode and a cathode electrode in electric connection to said other surface of said first semiconductor substrate or said first semiconductor layer; and forming the other of the anode electrode and the cathode electrode in electric connection to said other surface of said second semiconductor substrate or said second semiconductor layer.

8. A method according to claim 1, further comprising a step of disposing a plurality of high impurity concentration regions spaced apart by a predetermined interval on said surface of said first semiconductor substrate after said step of preparing said first and second semiconductor substrates.

9. A method according to claim 8, wherein said recesses are defined between said plurality of high impurity concentration regions spaced apart by said predetermined interval.

10. A method according to claim 1, further comprising a step of disposing a plurality of high impurity concentration regions spaced apart by a predetermined interval on said surface of said second semiconductor substrate after said step of preparing said first and second semiconductor substrates.

11. A method according to claim 10, wherein said plurality of high impurity concentration regions are disposed corresponding to said exposed surface excluding said recesses defined in said first semiconductor substrate.

12. A method of fabricating a semiconductor device, comprising the steps of:
preparing a first semiconductor substrate and a second semiconductor substrate, both of one conductivity type;
defining recesses in a surface of said first semiconductor substrate with said surface exposed between said recesses;
joining said surface of the first semiconductor substrate which is exposed between said gate regions to a surface of said second semiconductor substrate; and
thereafter, forming gate regions of other conductivity type which are doped with an impurity, in regions of said first semiconductor substrate which are exposed at side walls and bottoms of the recesses, and regions of said surface of said second semiconductor substrate which are exposed in said recesses.

13. A method according to claim 12, wherein after said gate regions are formed, insulating films are formed in said recesses in covering relation to said gate regions, and thereafter said surface of the first semiconductor substrate which is exposed between said gate regions is joined to said surface of said second semiconductor substrate.

14. A method according to claim 12, further comprising the step of:
after said surface of the first semiconductor substrate which is exposed between said gate regions is joined to said surface of said second semiconductor substrate, forming oxide films on side walls and bottoms of the recesses and regions of said surface of said second semiconductor substrate which are exposed in said recesses.

15. A method according to claim 12, further comprising the step of:
before said surface of the first semiconductor substrate which is exposed between said gate regions is joined to said surface of said second semiconductor substrate, forming gate electrodes disposed in said recesses, said gate electrodes being made of a good electric conductor electrically connected to said gate regions.

16. A method according to claim 15, further comprising the step of:
before said surface of the first semiconductor substrate which is exposed between said gate regions is joined to said surface of said second semiconductor substrate, forming insulating films in said recesses in covering relation to said gate electrodes.

17. A method according to claim 15, further comprising the step of:
after said surface of the first semiconductor substrate which is exposed between said gate regions is joined to said surface of said second semiconductor substrate, forming oxide films in covering relation to regions of said first semiconductor substrate which are exposed at side walls and bottoms of the recesses, regions of said surface of said second semiconductor substrate which are exposed in said recesses, and said gate electrodes.

18. A method according to claim 12, further comprising the steps of:
forming a first semiconductor layer of said other conductivity type on either one of another surface of said first semiconductor substrate which lies opposite to said surface thereof and another surface of said first semiconductor substrate which lies opposite to said surface thereof;
forming one of an anode electrode and a cathode electrode in electric connection to said other surface of said first semiconductor substrate or said first semiconductor layer; and
forming the other of the anode electrode and the cathode electrode in electric connection to said other surface of said second semiconductor substrate or said second semiconductor layer.

19. A method according to claim 12, further comprising a step of disposing a plurality of high impurity concentration regions spaced apart by a predetermined interval on said surface of said first semiconductor substrate after said step of preparing said first and second semiconductor substrates.

20. A method according to claim 19, wherein said recesses are defined between said plurality of high impurity concentration regions spaced apart by said predetermined interval.

21. A method according to claim 12, further comprising a step of disposing a plurality of high impurity concentration regions spaced apart by a predetermined interval on said surface of said second semiconductor substrate after said step of preparing said first and second semiconductor substrates.

22. A method according to claim 21, wherein said plurality of high impurity concentration regions are disposed corresponding to said exposed surface excluding said recesses defined in said first semiconductor substrate.

23. A method of fabricating a semiconductor device, comprising the steps of:
preparing a first semiconductor substrate and a second semiconductor substrate, both of one conductivity type;
defining recesses in a surface of said first semiconductor substrate;
selectively forming gate regions of other conductivity type which are doped with an impurity, in regions of said first semiconductor substrate which are exposed at least at side walls of the recesses, with said surface of the first semiconductor substrate being exposed between said gate regions;
joining said surface of the first semiconductor substrate which is exposed between said gate regions to a surface of said second semiconductor substrate; and
then forming oxide films on side walls and bottoms of the recesses and regions of said surface of said second semiconductor substrate which are exposed in said recesses.

24. A method of fabricating a semiconductor device, comprising the steps of:
preparing a first semiconductor substrate and a second semiconductor substrate, both of one conductivity type;

defining recesses in a surface of said first semiconductor substrate;

forming gate electrodes disposed in said recesses, said gate electrodes being made of a good electric conductor electrically connected to said gate regions;

selectively forming gate regions of other conductivity type which are doped with an impurity, in regions of said first semiconductor substrate which are exposed at least at side walls of the recesses, with said surface of the first semiconductor substrate being exposed between said gate regions;

joining said surface of the first semiconductor substrate which is exposed between said gate regions to a surface of said second semiconductor substrate; and then forming oxide films in covering relation to regions of said first semiconductor substrate which are exposed at side walls and bottoms of the recesses, regions of said surface of said second semiconductor substrate which are exposed in said recesses, and said gate electrodes.

* * * * *